United States Patent [19]

Asher

[11] Patent Number: 5,159,159

[45] Date of Patent: Oct. 27, 1992

[54] TOUCH SENSOR AND CONTROLLER

[76] Inventor: David J. Asher, P.O. Box 8748, Albany, N.Y. 12208

[21] Appl. No.: 624,145

[22] Filed: Dec. 7, 1990

[51] Int. Cl.⁵ .............................. G08C 21/00
[52] U.S. Cl. ..................................... 178/18
[58] Field of Search .............. 178/18, 19, 20

[56] References Cited

U.S. PATENT DOCUMENTS

| | | | |
|---|---|---|---|
| 4,129,747 | 12/1978 | Pepper, Jr. | 178/19 |
| 4,252,391 | 2/1981 | Sado | 339/60 |
| 4,258,100 | 3/1981 | Fujitami et al. | 428/315 |
| 4,273,682 | 6/1981 | Kanamori | 252/511 |
| 4,293,734 | 10/1981 | Pepper, Jr. | 178/18 |
| 4,302,361 | 11/1981 | Kotani et al. | 252/503 |
| 4,315,238 | 2/1982 | Eventoff | 338/99 |
| 4,475,008 | 10/1984 | Doi et al. | 178/18 |
| 4,570,149 | 2/1986 | Thornburg et al. | 338/114 |
| 4,587,378 | 5/1986 | Moore | 178/18 |
| 4,644,100 | 2/1987 | Brenner et al. | 178/18 |
| 4,734,034 | 3/1988 | Maness et al. | 433/68 |
| 4,739,299 | 4/1988 | Eventoff et al. | 338/99 |
| 4,745,301 | 5/1988 | Michalchick | 307/119 |
| 4,752,655 | 6/1988 | Tajiri et al. | 178/18 |
| 4,775,765 | 10/1988 | Kimura et al. | 178/18 |
| 4,790,968 | 12/1988 | Ohkawa et al. | 264/104 |
| 4,798,919 | 1/1989 | Miessler et al. | 178/18 |
| 4,810,992 | 3/1989 | Eventoff | 338/99 |
| 4,856,993 | 8/1989 | Maness et al. | 433/68 |
| 4,897,511 | 1/1990 | Itaya et al. | 128/18 |
| 4,963,417 | 10/1990 | Taniguchi et al. | 178/18 |
| 4,983,786 | 1/1991 | Stevens et al. | 178/18 |

OTHER PUBLICATIONS

Application Ser. No. 07/497,691, filed Mar. 22, 1990, David Asher, "Touch Controller".
Buxton et al., 1985, "Issues and Techniques in Touch-Sensitive Tablet Input".
Horowitz and Hill, 1980, "The Art of Electronics".
Mark Stitt, 1989, "Implementation and Applications of Current Sources and Current Receivers".
Steve Gurley, 1984, "Flexible Circuits".
Albert Kosoloff, 1980, "Screen Printing Electronic Circuits".

Primary Examiner—Stafford D. Schreyer

[57] ABSTRACT

A touch sensor is disclosed that senses the two-dimensional position and pressure of an object 34, such as a stylus or finger, that is touching its surface. The sensor is comprised of two insulating substrates 28 and 29 which extend over the area to be sensed. A first fixed resistor 33 establishes a potential gradient over the first substrate 29 in a first, or X, position dimension. A second fixed resistor 32 establishes a potential gradient over the second substrate 28 in a second, or Y, position dimension. Between the substrates is a force variable resistor 42 that changes its local resistance under the touch point as a function of the touch pressure. Two touch controllers are also disclosed that comprise the touch sensor 50 and an electronic circuit that accurately measures the resistance values of the touch sensor. The touch controllers output three signals: the X position, the Y position, and the pressure of the touch point. The first touch controller uses a current regulator 51 to supply a constant current through the touch sensor. The second touch controller uses a voltage regulator 67 to supply a constant voltage across the touch sensor.

17 Claims, 20 Drawing Sheets

TOUCH SENSOR AND CONTROLLER

FIELD OF THE INVENTION

This invention relates to devices for providing information, in the form of electrical signals, about the position and pressure of a selected touch point on the surface of a touch sensor. In particular, these devices are well suited for use as human-computer interfaces, both as general computer input devices and as controllers for dedicated electronics systems.

BACKGROUND OF THE INVENTION

Many touch controllers (also known as "pads", "panels", "tablets", or "digitizers") are known in the prior art. U.S. Pat. No. 4,129,747 (Pepper, Jr., 1978) describes a two-axis pressure-sensitive touch controller that uses a resistive sheet with sinusoidal phase fields established across its surface. In one embodiment, the user directly contacts the resistive sheet, thereby changing the impedance of the resistive sheet at the touch point, however this gives unreliable and unpredictable results because the impedance of the user's body is unpredictable. Another embodiment uses a conductive pickup layer in a sandwich with the resistive layer, which relies only on the area of touch for sensing the pressure dimension, which is also an unreliable technique. Further, both embodiments require complicated electronics to generate two sinusoids in quadrature and accurately detect phase shifts.

U.S. Pat. No. 4,293,734 (Pepper, Jr., 1981) improves on the first embodiment of U.S. Pat. No. 4,129,747, however this device requires rectifiers and analog dividers which reduce the accuracy of the position data.

U.S. Pat. No. 4,644,100 (Brenner et. al., 1987) describes a pressure-sensitive touch panel based on surface acoustic wave propagation over a glass substrate. This technology is expensive to apply; it requires a specialized sensor with etchings and attached transducers, and complicated and expensive electronics. Further, it operates on the principle that the user's finger acoustically dampens the propagating signal, which produces an unpredictable pressure measurement.

Many non-pressure-sensitive touch tablets based on resistive technologies have been described in the prior art, including U.S. Pat. Nos. 4,570,149 (Thornburg et al., 1986); 4,587,378 (Moore, 1986); 4,752,655 (Tajiri et al., 1988); and 4,897,511 (Itaya et al., 1990). Although the present invention has similarities to some of these devices, they do not provide for the sensing of continuous variation in touch pressure.

Of particular interest among non-pressure-sensitive touch tablets are U.S. Pat. Nos. 4,475,008 (Doi et al., 1984) and 4,775,765 (Kimura et al., 1988). Both patents disclose multilayer devices that employ an intermediate pressure-sensitive layer which decreases in resistance locally at the point where applied pressure is increased. However, both devices only use this material in a switching mode and do not provide for continuous sensing of pressure.

U.S. Pat. No. 4,798,919 (Miessler et al., 1989) describes a pressure-sensitive touch tablet based on a single semiconductive resistive sheet, facing a conductive sheet. Applied pressure causes the resistive sheet to reduce its resistance locally at the touch point, while its resistance remains constant everywhere else. The nature of the resistive sheet results in nonlinearity between the true touch position and the reported position. Further, the driving electronics require analog division which further reduce the device's accuracy, and further increase its cost and complexity.

U.S. Pat. No. 4,739,299 (Eventoff et al., 1988) describes a pressure-sensitive touch pad using a pressure-sensitive resistor layer. The touch position is detected using fixed-value resistive sheets, which suffer the same problem of touch position nonlinearity as U.S. Pat. No. 4,798,919.

U.S. Pat. No. 4,810,992 (Eventoff, 1989) discloses another pressure-sensitive touch pad wherein the touch position is linearized within the sensor using a pattern of parallel conductive traces attached to a fixed resistor, in a similar fashion to the earlier non-pressure-sensitive resistive touch pads. However, this solution required the touch sensor to be divided into two overlapping but electrically isolated touch sensors, one sensor for each position dimension. This arrangement reduces the touch sensitivity and reliability of the device because the activating force must press through the upper sensor in order to activate the lower sensor. Further, current flows across the plane of the force variable resistor sheet, rather than perpendicular to the plane, which increases the mechanical contact noise; decreases the standoff resistance; and often exhibits an unnatural force-to-resistance curve. This embodiment also produces two pressure signals, which is more complicated and ambiguous to process than a single pressure signal.

U.S. Pat. Nos. 4,734,034 (Maness et al., 1988) and 4,856,993 (Maness et al., 1989) describe a pressure-sensitive contact sensor which comprises a simple and reliable touch sensor, however the sensor is used in a scanning mode. While this has the advantage of detecting multiple independent touch points, it comes at the cost of requiring an enormous number of terminal contacts from the sensor to the connecting electronics; the scanning hardware is fairly complex and requires a high-speed analog-to-digital converter; the response time is slow due to the time required to complete a scan; very high data rates are produced which incur a computational and memory overhead to process and interpret the data; and the system cost and complexity increase exponentially for linear increases in touch sensor size or resolution. In many applications, only a single touch point need be detected, so that the overhead incurred by scanning is uneconomical.

Copending U.S. patent application Ser. No. 07/497,691 (Asher, filed Mar. 22, 1990), U.S. Pat. No. 5,008,497 describes a touch controller which comprises a current regulator and differential amplifier as an improved electronic circuit for measuring the position and pressure of a touch point on a touch sensor that uses a resistive membrane and force variable resistor. The present invention, however, discloses a touch sensor that represents significant improvements over the prior art of touch sensors. Accordingly, the present invention also discloses two touch controllers that comprise electronic circuits that are further improved and optimized for the new touch sensor.

OBJECTS AND ADVANTAGES OF THE INVENTION

The principle object of the present invention is to provide a new touch sensor design that passively detects the two-dimensional position and pressure of an object touching its surface through changes in resistance, which changes may then be measured by an electronic circuit. Of particular significance is that, compared to the prior art, the new touch sensor maximizes performance while achieving very low production cost.

The performance criteria include: position resolution, pressure resolution, wide dynamic range of pressure sensitivity, fast response time, position accuracy over the full dynamic range, simultaneous contact of X and Y dimensions, linearity of the position measurements to actual position, "natural" response of the pressure measurement to actual pressure, and low susceptibility to contact noise and external interference.

Cost criteria include: amount of raw materials used, type of materials used, ease of manufacture, simplicity of electrical interconnection to external circuits, and inelasticity of circuit and system cost to changes in touch sensor size and resolution.

Another object of the present invention is to provide numerous variations on touch sensor design and fabrication methods so that cost and performance may be optimized for particular applications.

Another object of the present invention is to provide a touch controller that comprises the touch sensor and an electronic circuit which interfaces to the touch sensor, providing measurements of the two-dimensional position and pressure of the object touching the surface of the touch sensor. The outputs of the touch controller are direct, linear representations of the actual touch position and pressure.

Another object of the present invention is to provide a touch controller that reports the two-dimensional position and pressure of the object, the measured outputs having high accuracy, resolution, and fast response time, and the electronic circuit having low cost and complexity. Numerous variations on touch controller circuit design are presented so that cost and performance may be optimized for particular applications.

Another object of the present invention is to enable the user to activate the touch sensor with a finger or with a stylus while not requiring electrical connection to the finger or stylus. This feature allows a wide variety of surface coverings over the touch sensor, such as Lexan or Teflon, which protect the sensor, provide different tactile surfaces, and allow for limitless graphic overlays to support the user.

In general computing applications, the present invention can be used as a cursor control pointing device, as well as many other ways. In the paper "Issues and Techniques in Touch-Sensitive Tablet Input", 1985, William Buxton et al. discuss human-factors issues in using touch tablets for human-computer interaction, and in particular cite the need for pressure-sensitive touch controllers.

A pressure-sensitive touch controller can perform the input and cursor control functions of a mouse, joystick, trackball, light pen, or digitizer tablet, with the enhanced feature that the pressure signal provides an additional independent control dimension. The touch position can be mapped to absolute video screen coordinates, as with digitizer tablets and light pens. The touch position can also be mapped to relative video screen coordinates, as with trackballs and mice. The touch position can also be mapped to changes in screen coordinates, as with joysticks. Graphic overlays can also indicate multiple touch zones, or fixed-function areas.

A small touch controller can be embedded directly into a laptop computer or notebook computer, or a larger touch controller can be used as a separate input peripheral to a desktop computer or terminal.

In typical office software applications, such as word processors and spreadsheets, the pressure dimension could be used to modulate cursor speed, data entry, scrolling rates of file lists or document pages, etc.

As a graphics input device, the present invention can be used as a drawing, painting, or calligraphy tool where the pressure dimension modulates line width or shape parameters.

One specialized computer input application is interactive control of video games. A pressure-sensitive touch controller would enable the player to have three dimensions of control of a virtual on-screen object with a single, intuitive touch gesture: the player could fly a virtual plane or paint in a virtual coloring book.

Another specialized computer input application is control of electronic musical instruments. Although touch devices, such as ribbon controllers, have been known in the industry for many years, the pressure dimension provides a critical control parameter. The pressure dimension can control the volume and timbre of a sound in such a musically intuitive way that the performance nuance of a clarinet, violin, or trombone can be imitated with simple finger gestures.

In dedicated control applications, three-dimensional processes can be easily controlled with a pressure-sensitive touch controller, such as steering a robotic manipulator or controlling the imaging process of medical instrumentation. The pressure dimension can further act as a "dead man's handle" in safety-critical situations where the presence of touch must be unambiguously detected.

The present invention represents a very general technology that has many specific applications in the growing field of human-computer interaction. Particularly, in the field of pressure-sensitive touch controllers, this invention achieves a new level of high performance and low cost that has not been demonstrated in the prior art.

SUMMARY OF THE INVENTION

In its most general form, the touch sensor of the present invention comprises a lower, or X, substrate; an X fixed resistor which establishes a potential gradient along an X dimension relative to the X substrate; two X terminals connected to the X fixed resistor; an upper, or Y substrate; a Y fixed resistor which establishes a potential gradient along a Y dimension relative to the Y substrate; two Y terminals connected to the Y fixed resistor; and a force variable resistor sandwiched between the upper (Y) and lower (X) substrates.

When a disjunct member, such as a finger or stylus, presses on the upper substrate of the touch sensor, the local resistance of the force variable resistor under the touch point decreases, and further decreases as the disjunct member increases pressure. The touch point also temporarily divides the X fixed resistor into two segments, and similarly divides the Y fixed resistor into two segments; the fixed resistor segments forming electrical nodes with the force variable resistor.

The touch sensor itself is passive; it only represents the position and pressure of the touch point through changes in resistance, which are electronically measured to produce distinct signals representing the touch point. The position of the disjunct member on the surface of the touch sensor can be determined by measuring the resistance of the fixed resistor segments, and the pressure can be determined by measuring the resistance of the force variable resistor.

Many embodiments of the touch sensor are possible, including but not limited to: cartesian coordinate system position measurement; polar coordinate system position measurement; single-substrate assembly; two-sheet substrate assembly; integration into printed circuit boards; thin-film fixed resistors deposited on substrate; discrete fixed resistor networks; potential gradient established by a set of conductive traces; potential gradient established by a set of fixed resistor traces; potential gradient established by a resistive sheet; one or two force variable resistor layers; force variable resistor comprised of traces; force variable resistor comprised of a sheet; and multiple touch zones in the X and/or Y dimensions.

A touch controller, according to the present invention, employs an electronic circuit connected to the touch sensor. The circuit measures the resistances of the fixed resistor segments and of the force variable resistor, and outputs three signals: the X position of the touch point, the Y position of the touch point, and the touch pressure. The outputs of the electronic circuit are analog voltages that represent the touch point. In a typical application, the analog voltages are converted to digital signals by an analog-to-digital converter, so that they may be read into and interpreted by a microprocessor or computer.

A preferred embodiment of the electronic circuit of the touch controller comprises a current regulator and a differential amplifier connected to the touch sensor's terminals. The principle of operation is, no matter what the value of the force variable resistor might be, the current regulator guarantees a constant current flowing through the fixed resistors and through the force variable resistor.

As a result of the current regulation through the touch sensor, the differential voltage across either fixed resistor is linearly proportional to the touch position and does not require any scaling adjustments to compensate for varying touch pressure. This differential voltage is detected and amplified with a differential amplifier. Similarly, the differential voltage across the force variable resistor is linearly proportional to the resistance of the force variable resistor. Typically, this resistance is inversely proportional to the applied pressure.

There are many alternative construction techniques of the preferred embodiment of the touch controller, including but not limited to: ground-referenced current regulator with grounded touch sensor; floating current regulator with floating touch sensor; independent differential amplifiers for X and Y position measurement; pressure measurement derived from the current regulator output; pressure measurement derived from the voltage differential between common-mode position measurements; Wheatstone resistor bridges connected across each fixed resistor; current mirrors connected across each fixed resistor; single differential amplifier multiplexed across the touch sensor terminals with multiplexed X, Y, and pressure outputs; and additional analog multiplexers for calibration of the touch sensor's fixed resistors.

An alternative embodiment of the electronic circuit of the touch controller, which trades lower component cost for lower performance, comprises a voltage source, a single-ended amplifier, a set of analog multiplexers, and a pulldown resistor. The multiplexers switch the configuration of the voltage source and the single-ended amplifier across the terminals of the touch sensor. Position is measured by switching the voltage source across a fixed resistor, and detecting the voltage at the touch point through (i.e. in series with) the force variable resistor. Pressure is measured by switching the voltage source across the whole touch sensor in series with the pulldown resistor, forming a voltage divider.

Figure 1:
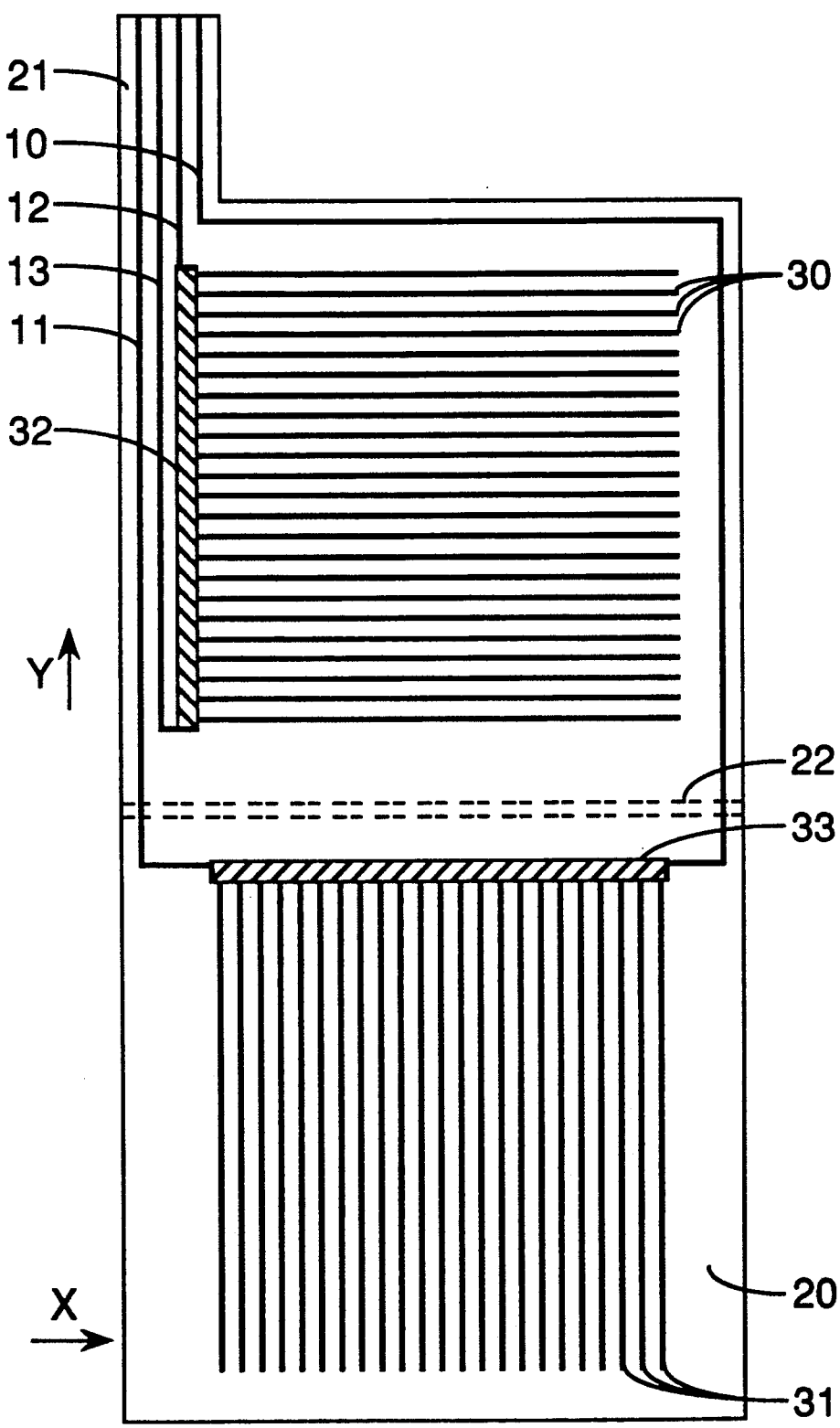
FIG. 1 shows a touch sensor pattern of conductive and resistive traces that measure position in cartesian coordinates over a square sensing area.

REFERENCE INDICIA OF THE DRAWINGS 10,11 . . . X terminals (conductive traces)
12,13 . . . Y terminals (conductive traces)
20 . . . insulating substrate including X and Y substrates
21 . . . substrate tab for electrical connectors
22 . . . fold between X substrate and Y substrate
23 . . . insulating film covering substrate traces
24,25 . . . insulating film aperture exposing Y, X traces
26 . . . connector from Y terminals onto X substrate
27 . . . outline from Y substrate onto X substrate
28,29 . . . Y, X insulating substrates
30,31 . . . Y, X conductive traces over sensing area
32,33 . . . Y, X fixed resistors
34 . . . disjunct member (finger, stylus, etc.)
40,41 . . . Y, X force variable resistor traces
42 . . . force variable resistor sheet
50 . . . touch sensor schematic symbol
51 . . . current regulator
52,53,54 . . . differential amplifiers: X, Y, pressure outputs
55 . . . operational amplifier for current regulator
56,57 . . . differential amplifiers with common mode outputs
58,59 . . . 1×2 analog multiplexers
60-63 . . . 1×4 analog multiplexers
64 . . . differential amplifier, multiplexed output
65 . . . single-ended amplifier, multiplexed output
66 . . . analog single-pole single-throw switch
67 . . . voltage regulator
Q1 . . . current reference transistor
Q2,Q3 . . . Y current mirror transistors
Q4,Q5 . . . X current mirror transistors
R1 . . . current reference resistor
R2,R3 . . . Y Wheatstone Bridge resistors
R4,R5 . . . X Wheatstone Bridge resistors
R6 . . . pull-down resistor

DETAILED DESCRIPTION OF THE INVENTION

FIG. 1 shows the basic fixed resistor and conductive trace pattern for a touch sensor that measures position in a cartesian coordinate system over a roughly square area. This basic touch sensor design is economical in that it is formed from a single substrate and therefore requires minimal assembly; all electrical terminations are brought forth from the touch sensor on the same side of a single connector lead, thereby simplifying interconnection to external circuits; and all conductive elements form a pattern that does not require an insulating layer to be deposited or inserted, which is often required to prevent such elements from electrically shorting together.

An insulating film 20 forms the substrate for the touch sensor. The insulating film could be a polyester film such as Mylar, which provides a cost-effective substrate for many applications. Other films may be used, such as Kapton, which provide greater dimensional stability over a wide temperature range, but at higher cost. Other insulating films may also be used.

Conductive traces 10-13, 30, and 31 are deposited on the substrate. The conductive traces may be directly printed on the substrate using electrically conductive inks. Other methods may also be used, such as photoetching of a thin metallic film that is laminated to the substrate. See *Flexible Circuits* by Steve Gurley, 1984.

One set of conductive traces 31 is arranged to detect position along the X dimension (horizontal) and another set of conductive traces 30 is arranged to detect position along the Y dimension (vertical). Two conductive traces 10 and 11 form the electrical terminals for external circuitry that measures touch position along the X dimension, and two other conductive traces 12 and 13 form the electrical terminals for external circuitry that measures touch position along the Y dimension. The pressure measurement is also derived from these terminals, as will be subsequently demonstrated.

Terminals 10-13 are brought forth from the touch sensor on a connector tab 21 that is conveniently cut from the substrate 20, such that all interface connections from the touch sensor to external circuitry are positioned on the same surface of a single substrate, which simplifies the fabrication of products that employ this touch sensor. However, two individual substrates for the X and Y traces may also be used with the terminals brought forth on independent connector tabs.

Two strips having fixed resistance 32 and 33 are also deposited on the substrate. The technology of formulating and applying conductive and resistive inks is well known. See *Screen Printing Electronic Circuits* by Albert Kosoloff, 1980 and 1984.

One fixed resistor 33 physically overlays one end of each of the X conductive traces 31, and each end of this resistive strip is connected to terminals 10 and 11. The other fixed resistor 32 overlays one end of each of the Y dimension conductive traces 30, and each end of this resistive strip is connected to terminals 12 and 13. Typical values for these fixed resistors range from 10K ohm to 100K ohm, as measured from the terminals, although resistance values outside of this range may also be used and the resistance values may be optimized for particular applications.

It can be seen in FIG. 1 that the X fixed resistor 33 with terminals 10 and 11 establish a potential gradient that varies with position. Each of the X conductive traces 31 is placed at a unique position (and electrical potential) along the X fixed resistor 33. The same is true for the Y fixed resistor 32, Y terminals 12 and 13, and Y conductive traces 30. For most applications, it is preferred that the resistive strips 32 and 33 have a constant resistance gradient over their length, and that the conductive traces 30 and 31 have equidistant intertrace spacing, so that the position measurements vary linearly with the true position of the object being detected. However, non-linear relationships between true and measured position are easily achieved by modifying the resistance gradient or the spacing between adjacent conductive traces.

To assemble the touch sensor, the substrate is simply folded in half along the dotted line 22, so that the X conductive traces 31 overlap, are oriented orthogonally to, and are facing the Y conductive traces 30. It is preferred that the touch sensor be glued or taped around the edges in order to keep it flat, although other methods of fastening may be used. Before the touch sensor is sealed, however, a force variable resistor is added between the X conductive traces 31 and the Y conductive traces 30. Several methods of accomplishing this will be demonstrated in subsequent figures.

Figure 2:
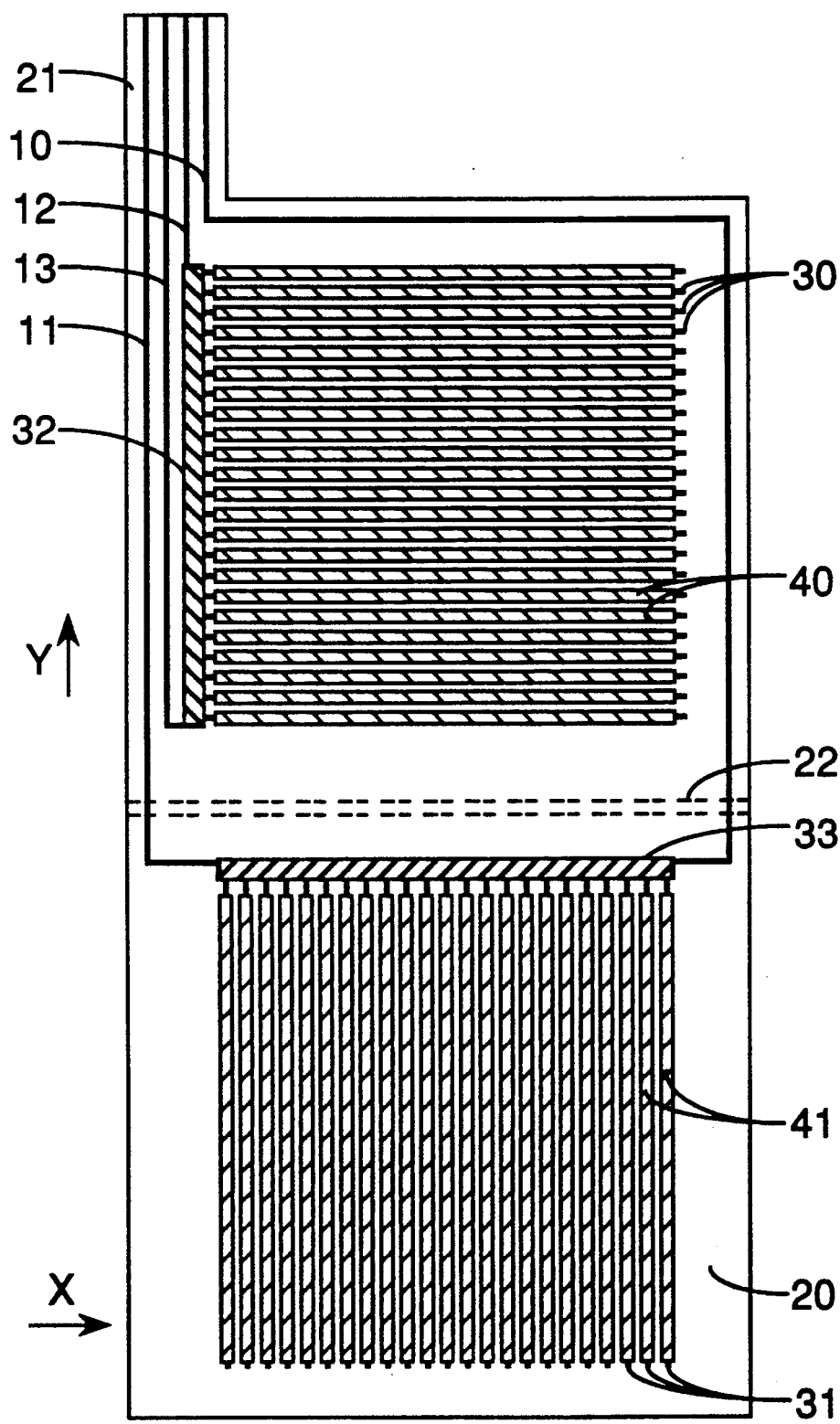
FIG. 2 shows a touch sensor with the pattern of FIG. 1 and force variable resistor traces deposited over the conductive traces within the sensing area.

FIG. 2 shows the touch sensor of FIG. 1 with a set of X force variable resistor traces 41 deposited over the X conductive traces 31, and with a set of Y force variable resistor traces 40 deposited over Y conductive traces 30. It is also possible to deposit a continuous force variable resistor layer that covers all of the X conductive traces, and a second continuous force variable resistor layer that covers all of the Y conductive traces, however individual traces will exhibit lower resistive crosstalk between adjacent conductive traces and therefore provide for higher accuracy.

It is also possible to cover only one side of the conductive traces (say, the X traces only) with a force variable resistor. However, it is preferred that both sets of conductive traces be covered with a force variable resistor so that the conductive traces are not openly exposed to the air, which can deteriorate them over time. Also, contact between two force-variable resistor layers exhibits lower mechanical contact noise than between a force-variable resistor and exposed conductive traces.

Once the touch sensor is completed by folding along 22, pressure from an external object on the outside of the touch sensor substrate 20 will cause at least one X force variable resistor trace 41 to contact at least one Y force variable resistor trace 40, thereby allowing current to flow from the X terminals 10 and 11, through the X fixed resistor 33, through an X conductive trace 31, through an X force variable resistor trace 41, through a Y force variable resistor trace 40, through a Y conductive trace 30, through the Y fixed resistor 32, and finally through the Y terminals 12 and 13.

In a preferred embodiment, the force variable resistors 40 and 41 are printed from a semiconductive ink that has the characteristics of behaving like an open circuit (infinite resistance) when there is no pressure applied, and monotonically decreasing in resistance as the applied pressure is increased. Preferably, the resistance of the force variable resistor is inversely proportional to the applied force, but other force-to-resistance curves may be formulated and preferred in particular applications.

The distinction between the terms "force" and "pressure" should be noted in this context, as the field of art supports such terms as "pressure-sensitive resistor" and "force-sensing resistor". Usually, these resistors are implemented as thin films or sheets, and the sense of force is understood to be perpendicular to the plane of the film or sheet, as is the direction of current flow. The resistance will change as a function of the force applied over a constant-sized area, as distinct from some sensors that change resistance as a function of the area over which the force is applied. The present invention senses the total force, rather than the average pressure—the total force being the integral of all pressures over the sensor surface.

Various force-sensitive resistive inks and coatings are known in the art, including: U.S. Pat. No. 4,745,301 (Michalchik 1988); U.S. Pat. No. 4,790,968 (Ohkawa et al. 1988); U.S. Pat. No. 4,315,238 (Eventoff 1982); and U.S. Pat. No. 4,856,993 (Maness et al. 1989), which are hereby incorporated by reference.

Figure 3:
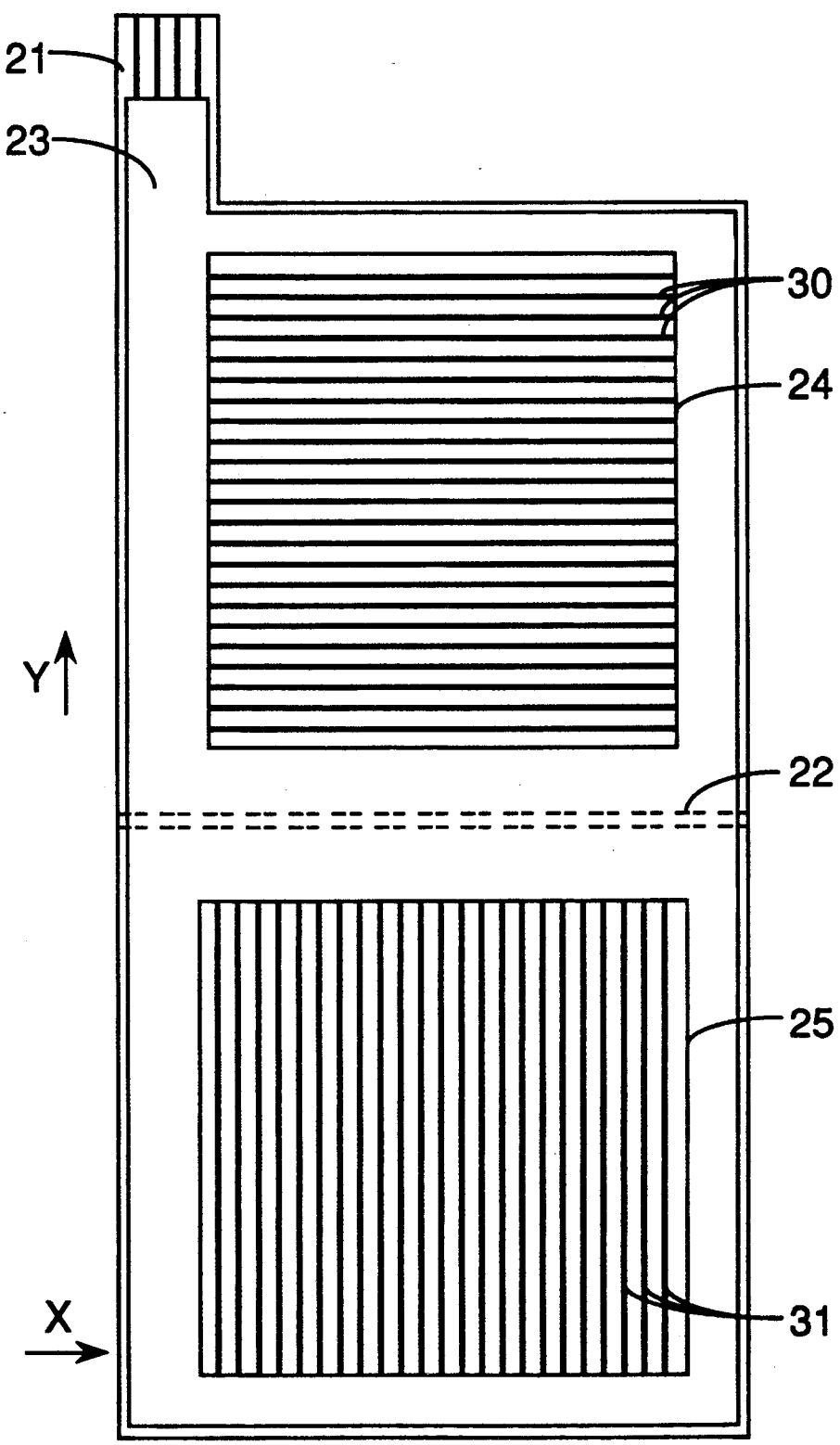
FIG. 3 shows a touch sensor with the pattern of FIG. 1 and an insulating film deposited over much of the conductive trace area outside of the sensing area.
Figure 4:
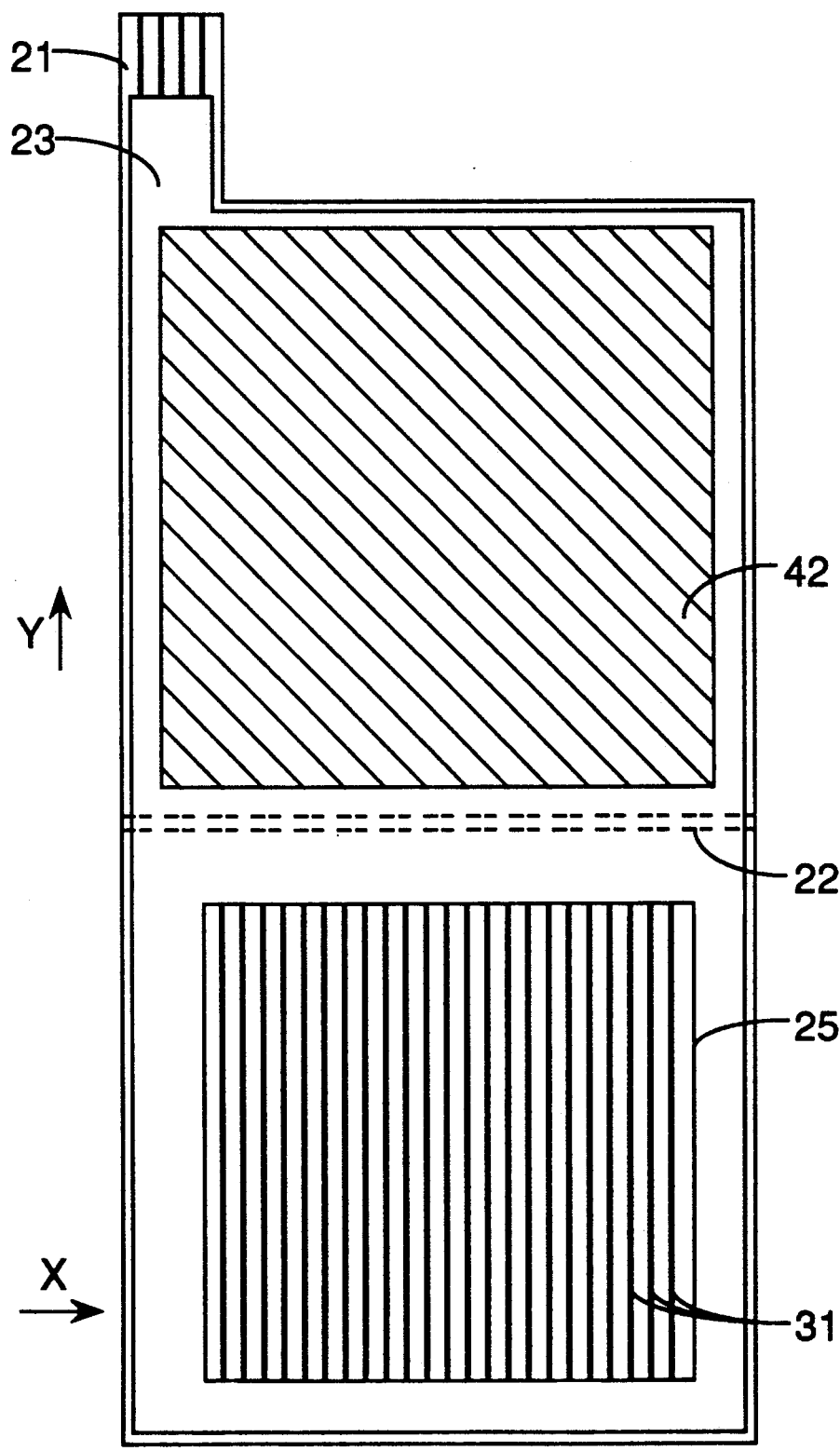
FIG. 4 shows the touch sensor of FIG. 3 and a square force variable resistor sheet that may be deposited or inserted over the sensing area.

Another method of employing a force variable resistor is demonstrated in FIGS. 3 and 4. FIG. 3 shows the touch sensor of FIG. 1, with an insulating layer 23 having an aperture 25 for traces 31 and another aperture 24 for traces 30. The insulating layer 23 can be printed or otherwise deposited onto the substrate, or alternatively could be an insulating film, such as Mylar, which is simply inserted in the touch sensor when it is assembled. The insulating layer could be used to prevent the various conductive traces and fixed resistors from making unwanted electrical contact.

A slightly thick insulating film, say 5 to 10 mils, could also be used to provide a standoff gap between the upper and lower substrate. This gap would ensure that no contact is made between traces of the upper and lower substrates when there is no external pressure on the touch sensor. However, when the force variable resistor exhibits infinite resistance with little or no applied force, such a gap is unnecessary.

FIG. 4 shows a force variable resistor sheet 42 which is placed between the X conductive traces and Y conductive traces (as opposed to being printed, sprayed, coated, etc.). Various methods for producing force-sensitive resistor sheets are also known in the art, including: U.S. Pat. No. 4,273,682 (Kanamori 1981); U.S. Pat. No. 4,302,361 (Kotani et al. 1981); U.S. Pat. No. 4,258,100 (Fujitani 1981); and U.S. Pat. No. 4,252,391 (Sado 1981), which are hereby incorporated by reference. Of particular interest in this application is Sado's patent for an anisotropically electroconductive sheet, which has a force-variable resistance in the direction perpendicular to the plane of the sheet, and high resistivity in all directions within the plane of the sheet.

Figure 5:
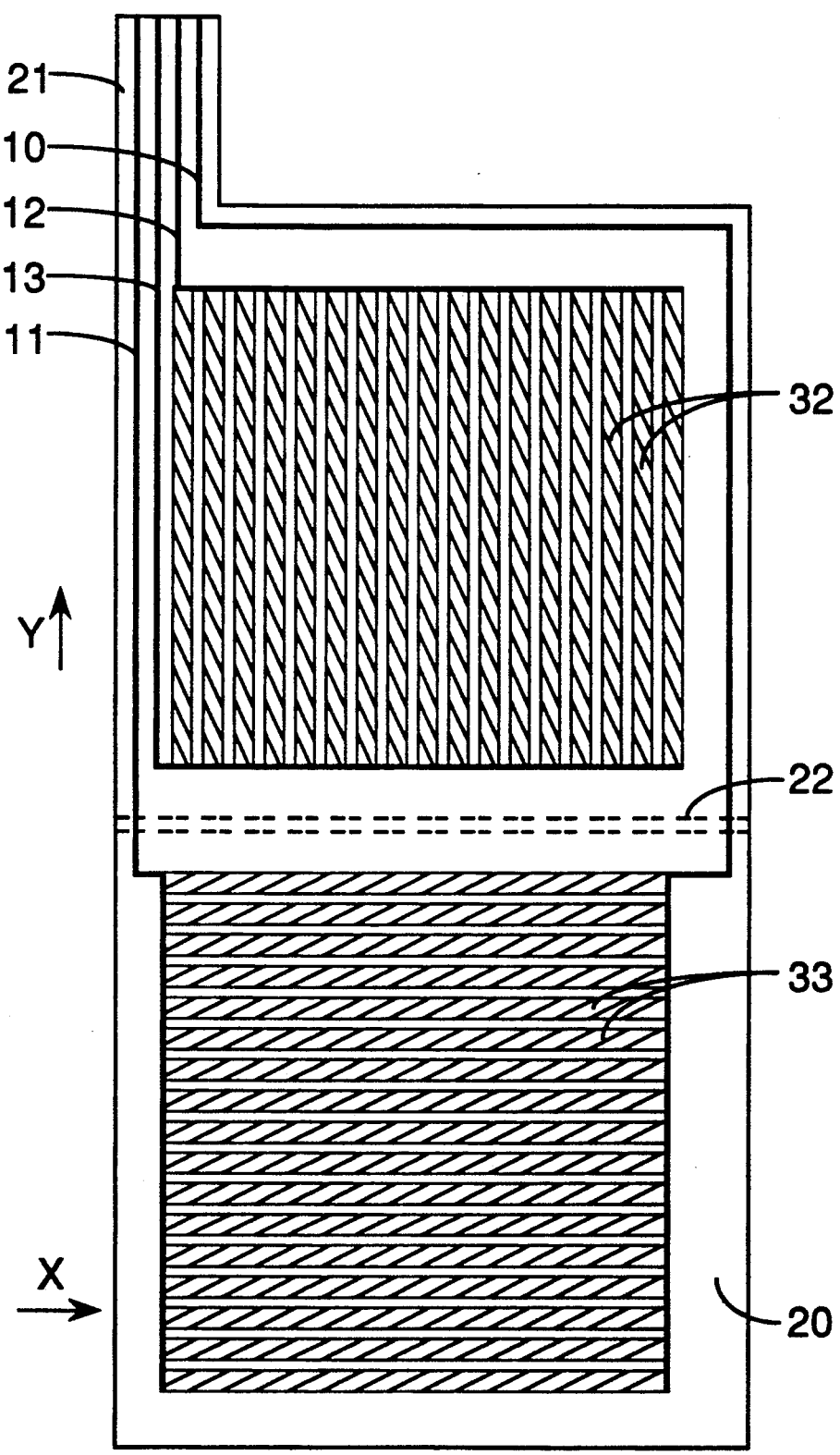
FIG. 5 shows a touch sensor pattern of conductive and resistive traces with two sets of fixed resistor traces extending over a square sensing area.

FIG. 5 shows a different method of forming the potential gradient. The X terminals 10 and 11 are extended over the sensing area along the Y dimension, and Y terminals 12 and 13 are similarly extended over the sensing area along the X dimension. The X fixed resistor 33, rather than being a single resistor outside of the sensing area, is now comprised of many X fixed resistor traces, each trace touching the X terminals 10 and 11, and the set of X fixed resistor traces being distributed along the Y dimension. Similarly, the Y fixed resistor 32 is comprised of a set of Y fixed resistor traces, each trace touching the Y terminals 12 and 13, and the set of Y fixed resistor traces being distributed along the X dimension.

The touch sensor of FIG. 5 may have a force variable resistor applied as in any of the above stated methods: deposited traces, deposited sheet, or inserted sheet. This touch sensor functions similarly to the touch sensors of FIGS. 1–4, except that the sets of conductive traces extending over the sensing area are not required.

Figure 6:
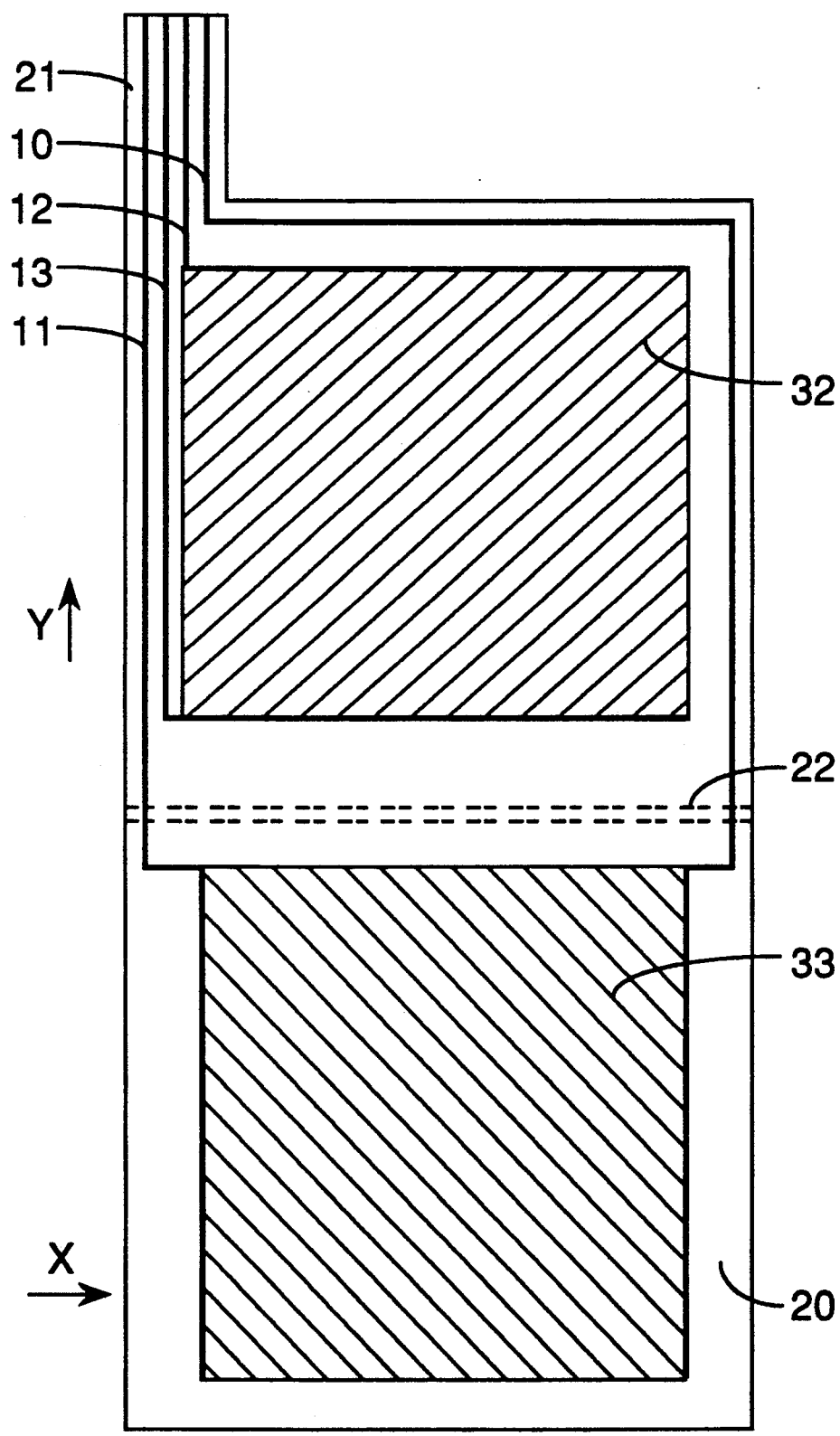
FIG. 6 shows a touch sensor pattern of conductive and resistive traces with two fixed resistor sheets extending over a square sensing area.

FIG. 6 shows yet a different method of forming the fixed resistor in order to effect position-sensing. The X terminals 10 and 11 are extended over the sensing area along the Y dimension, and the Y terminals 12 and 13 are extended over the sensing area along the X dimension. The fixed resistors 32 and 33, in this case, are thin film resistive sheets that are deposited on the substrate 20, each sheet contacting its respective terminals 10–13, and extending over the sensing area.

The touch sensors of FIGS. 1–5 are usually preferred over the touch sensor of FIG. 6 because they provide a precisely linear relationship between the actual position of the object being detected and the resulting resistance changes. However, because those touch sensors detect position using discrete traces, there is some quantization noise in the measurements when a very small object is being measured, such as the tip of a stylus. The touch sensor of FIG. 6 provides a purely smooth relationship between the measured and actual position because the fixed resistors are continuous sheets that directly sense the touch point, although there is some nonlinearity introduced because the current paths from the touch point to the terminals are no longer constrained to linear traces. However, because the substrate tends to distribute the applied force over several traces, the effect of quantization noise is not normally detectable.

Figure 7:
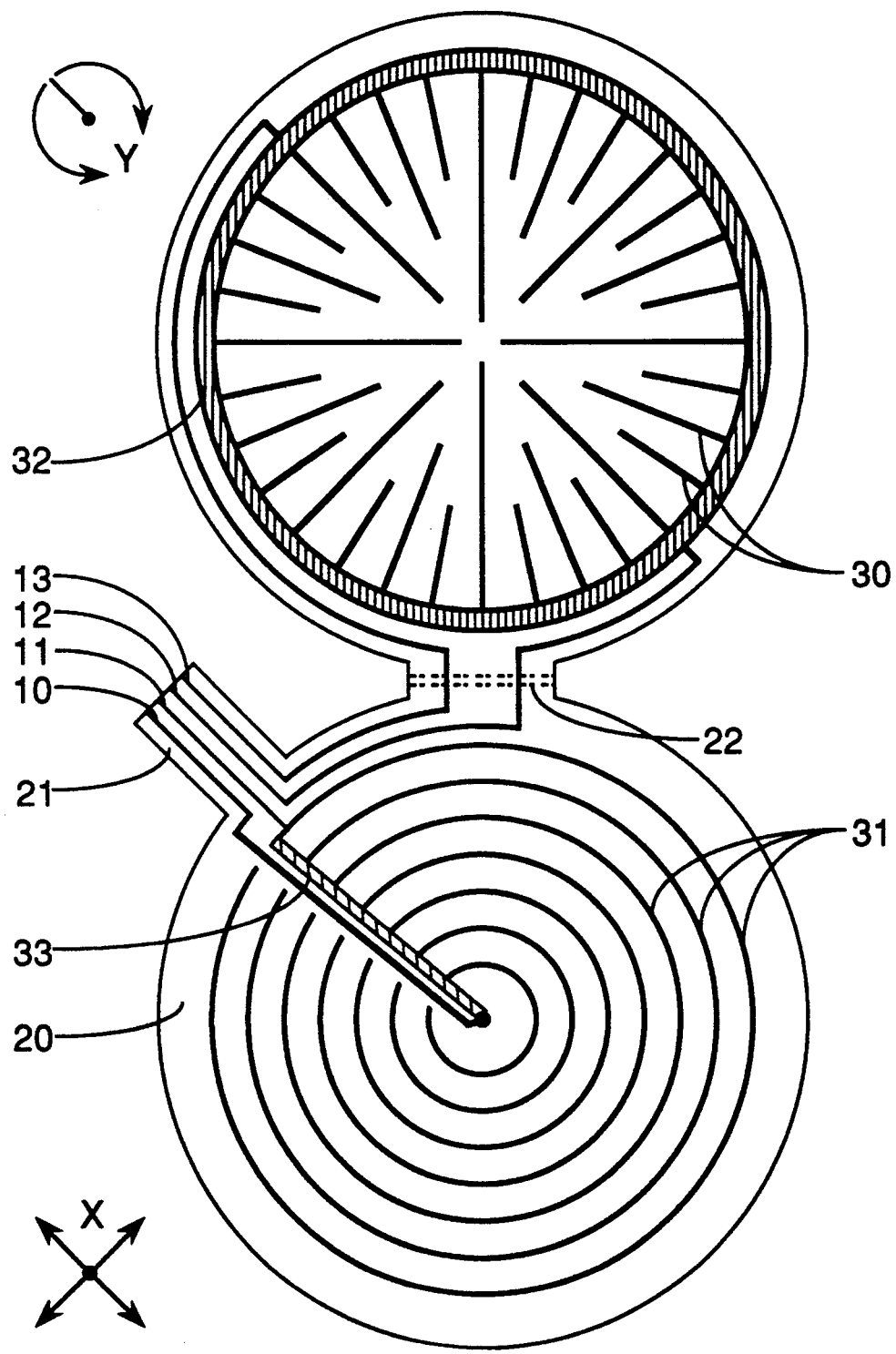
FIG. 7 shows a touch sensor pattern of conductive and resistive traces that measure position in polar coordinates over a circular sensing area.

FIG. 7 shows a touch sensor design that detects position in a polar coordinate system. The X fixed resistor 33 is a thin strip deposited on the substrate 20, and positioned with one end at the origin of the polar coordinate system. The X conductive traces 31 form a concentric circular pattern, centered about the origin of the polar coordinate system, and touching the X fixed resistor 33. The X position measurement will represent the radial distance of the touch point from the center of the system.

The Y fixed resistor 32 is an annulus deposited on the substrate 20, and centered about the origin of the polar coordinate system. The Y fixed resistor traces 30 form a radial pattern, also centered about the origin of the polar coordinate system, and touching the Y fixed resistor 32. The Y position measurement will represent the angular distance around the system; in this case the measurements are symmetrical about the diameter, from 0° to 180° and back to 0°.

Figure 8:
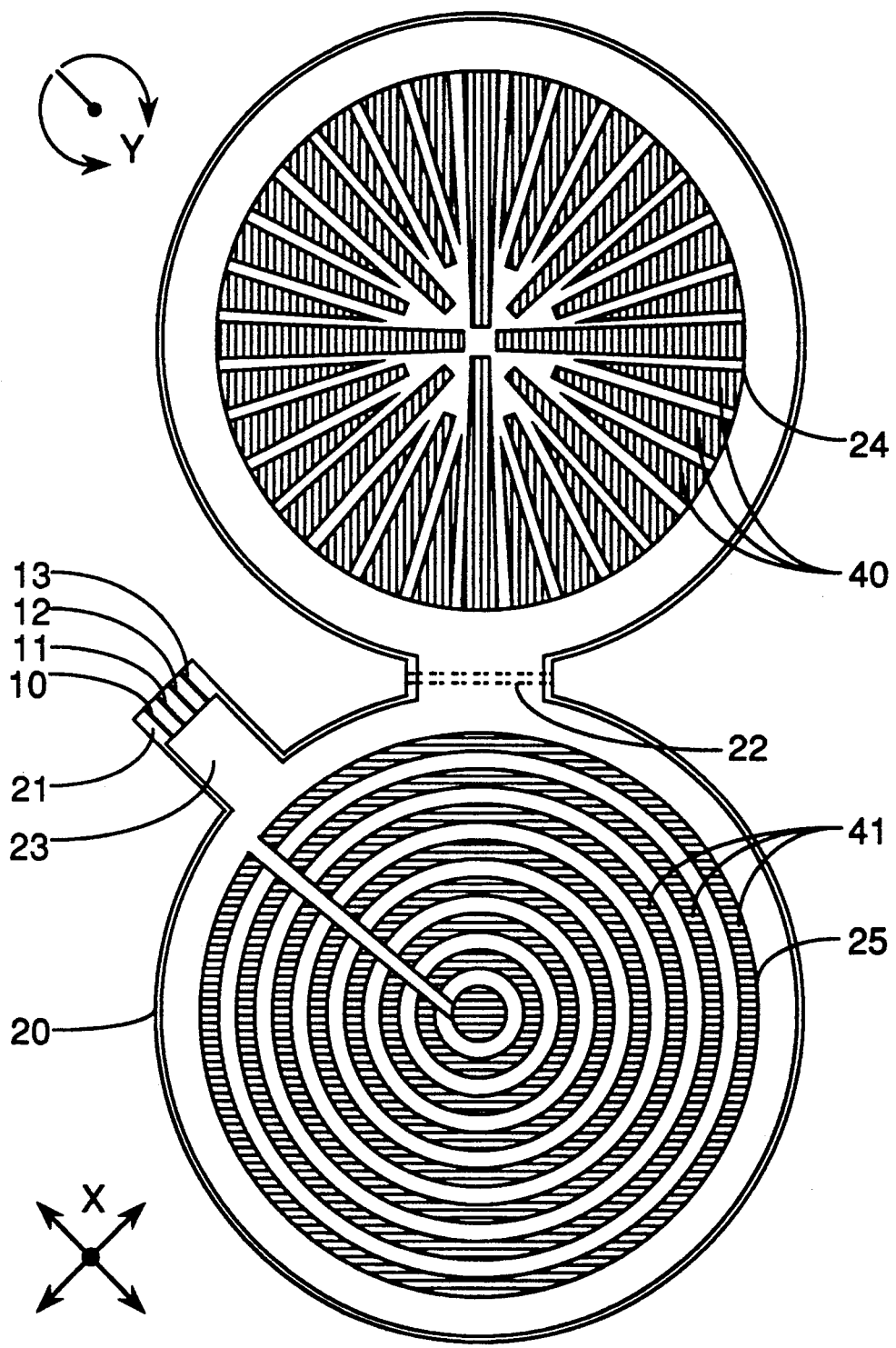
FIG. 8 shows a touch sensor with the pattern of FIG. 7 and force variable resistor traces deposited over the conductive traces within the sensing area.

FIG. 8 shows the touch sensor of FIG. 7 with force variable resistor traces deposited over the conductive traces. The X force variable resistor traces 41 are deposited over the X conductive traces, and the Y force variable resistor traces 40 are deposited over the Y conductive traces. With the exception of the shape of the conductive and force variable traces forming a polar coordinate system, this touch sensor functions identically to the touch sensor of FIG. 2.

Figure 9:
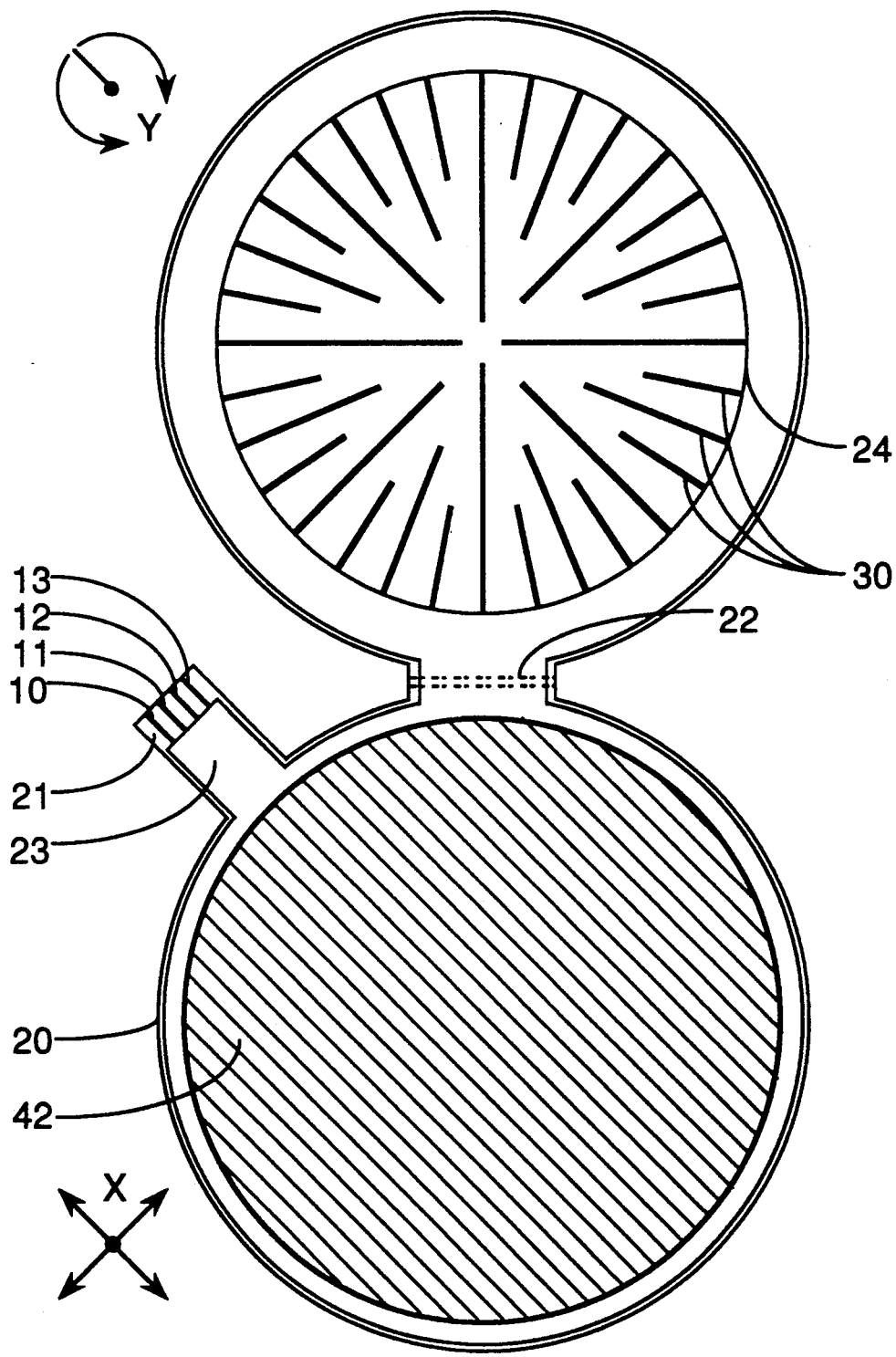
FIG. 9 shows a touch sensor with the pattern of FIG. 7 and a circular force variable resistor sheet that may be deposited or inserted over the sensing area.

FIG. 9 shows the touch sensor of FIG. 7, but with a single force variable resistor sheet 42, and insulating layer 23. With the exception of the pattern of the conductive, resistive, and force variable traces forming a polar coordinate system, this touch sensor functions identically to the touch sensor of FIG. 4. Touch sensors that measure position in a polar coordinate system may also be constructed using the methods employed in FIGS. 5 and 6: i.e. using fixed resistive traces or fixed resistive sheets over the sensing area.

Figure 10:
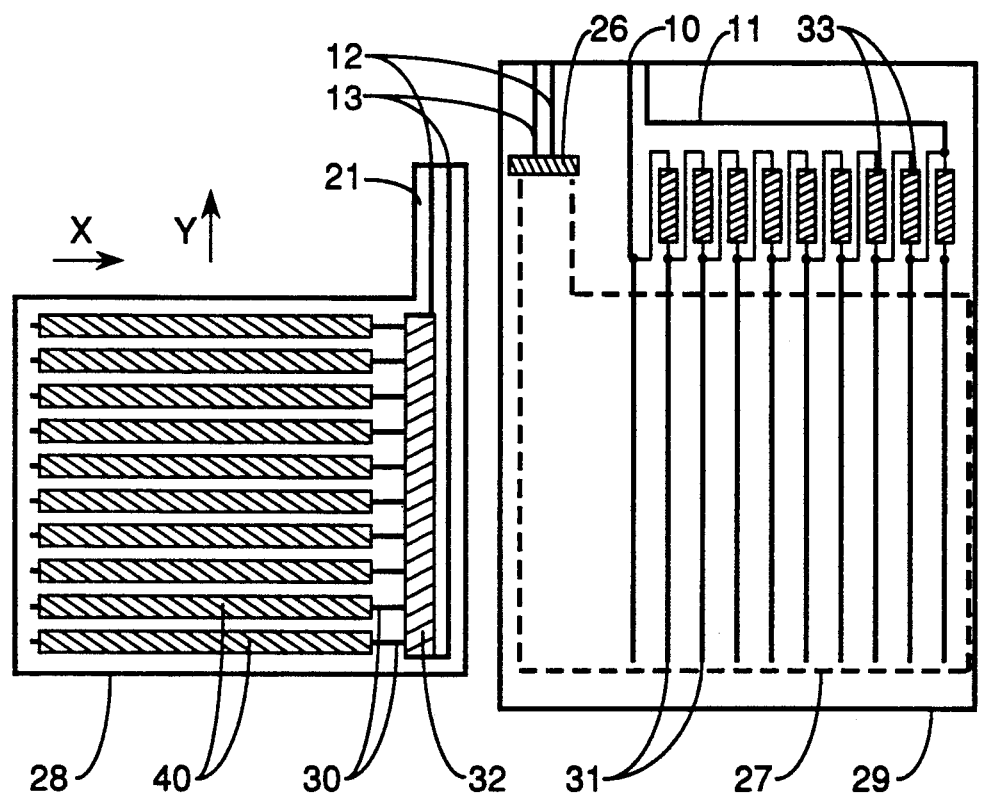
FIG. 10 shows a touch sensor having one substrate that is a printed circuit board and one fixed resistor that is a network of discrete resistors.

FIG. 10 shows an alternative construction of a touch sensor. The substrate is divided into two sections: an X substrate 29 and a Y substrate 28. The X substrate 29 is a printed circuit board, with conductive traces 31 deposited on the surface. The X fixed resistor 33 is comprised of many discrete resistors in a series interconnection, forming a resistor divider ladder, with each conductive trace electrically connected to a node in the resistor ladder.

The Y substrate 28 is a thin flexible film, with conductive traces 30, Y fixed resistor 32, Y terminals 12 and 13, and Y force variable resistor traces 40, all deposited directly on the Y substrate. The Y substrate 28 is positioned over the X substrate 29 so as to cover the X conductive traces 31, within the area marked by 27. A connector 26 attaches the Y terminals onto the X substrate.

Figure 11:
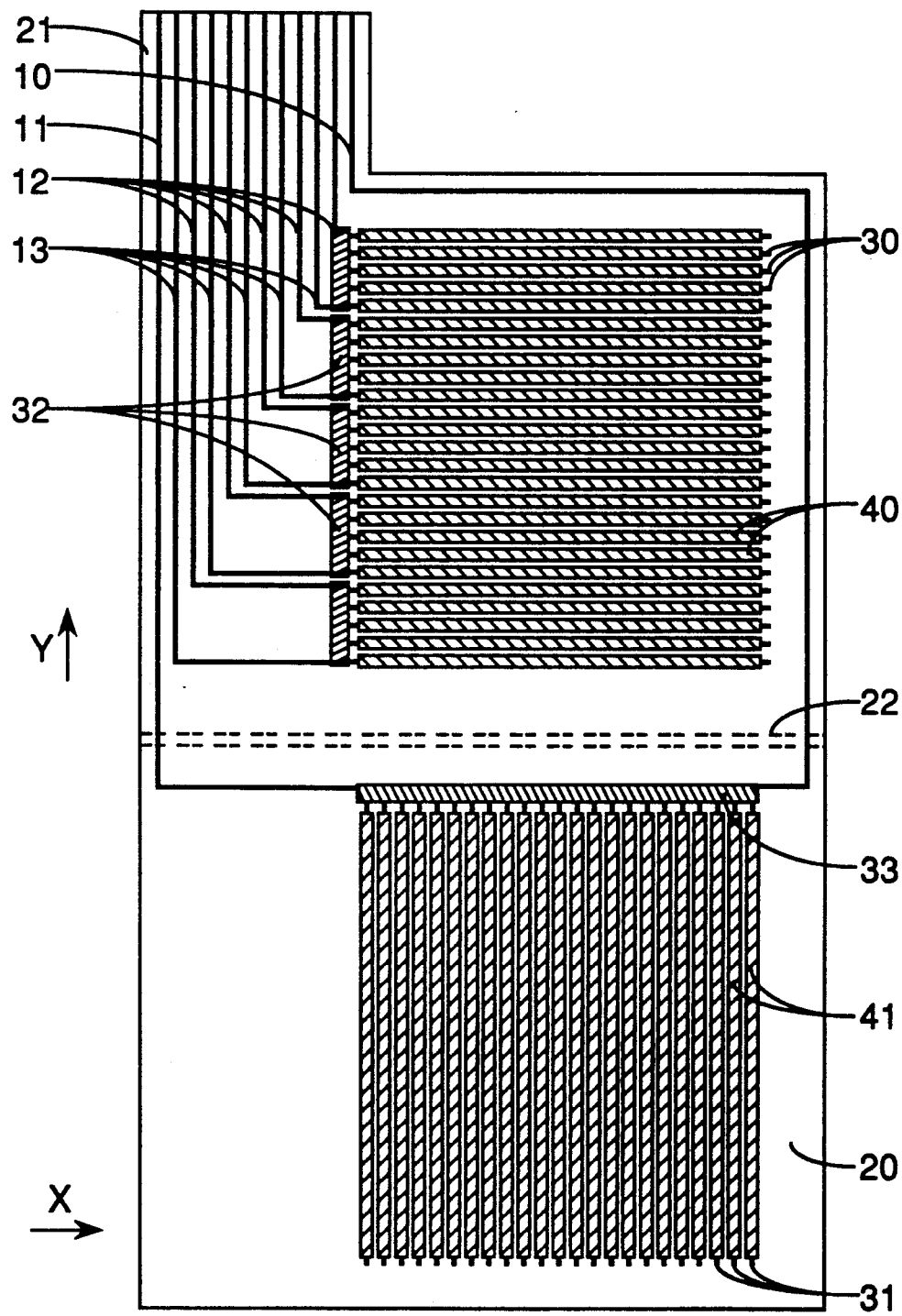
FIG. 11 shows a touch sensor with multiple rectangular touch zones.

FIG. 11 shows a touch sensor, similar to the touch sensor of FIG. 2, except the Y fixed resistor 32 is divided into several segments, forming several Y touch zones (five, in this case). Each Y fixed resistor segment also has independent terminals 12 and 13, so that each Y touch zone may be scanned in succession and may be analyzed independently of the other touch zones. As a result, each touch zone on the touch sensor can detect an individual touch point independently of the other touch zones. A similar scheme may be used to divide the X fixed resistor into segments, thereby creating a matrix of X-Y touch zones.

Figure 12:
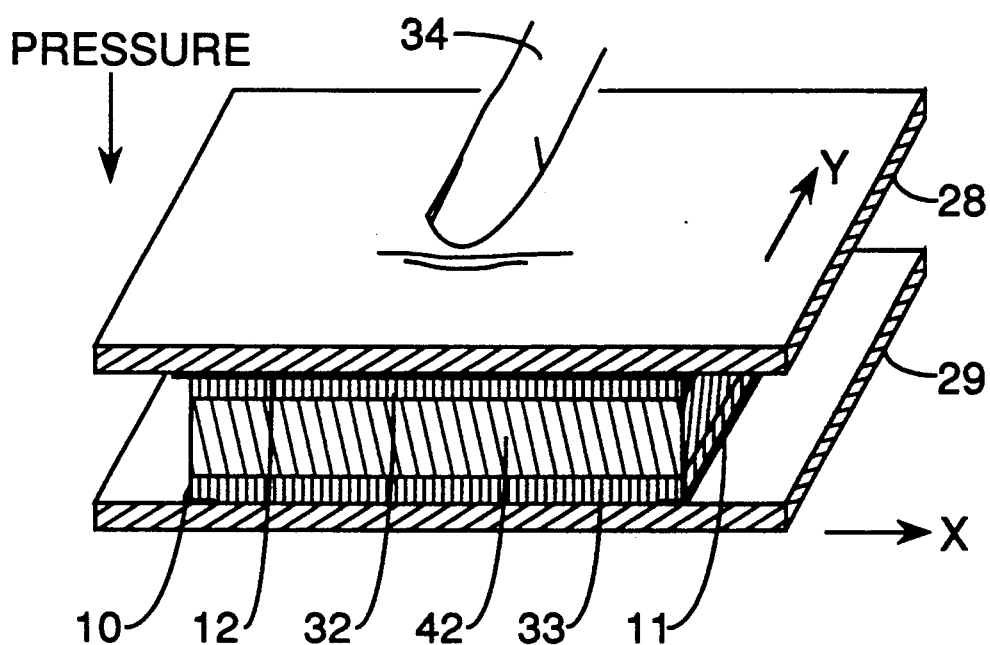
FIG. 12 shows a cut-away view of a general model of a touch sensor.
Figure 13:
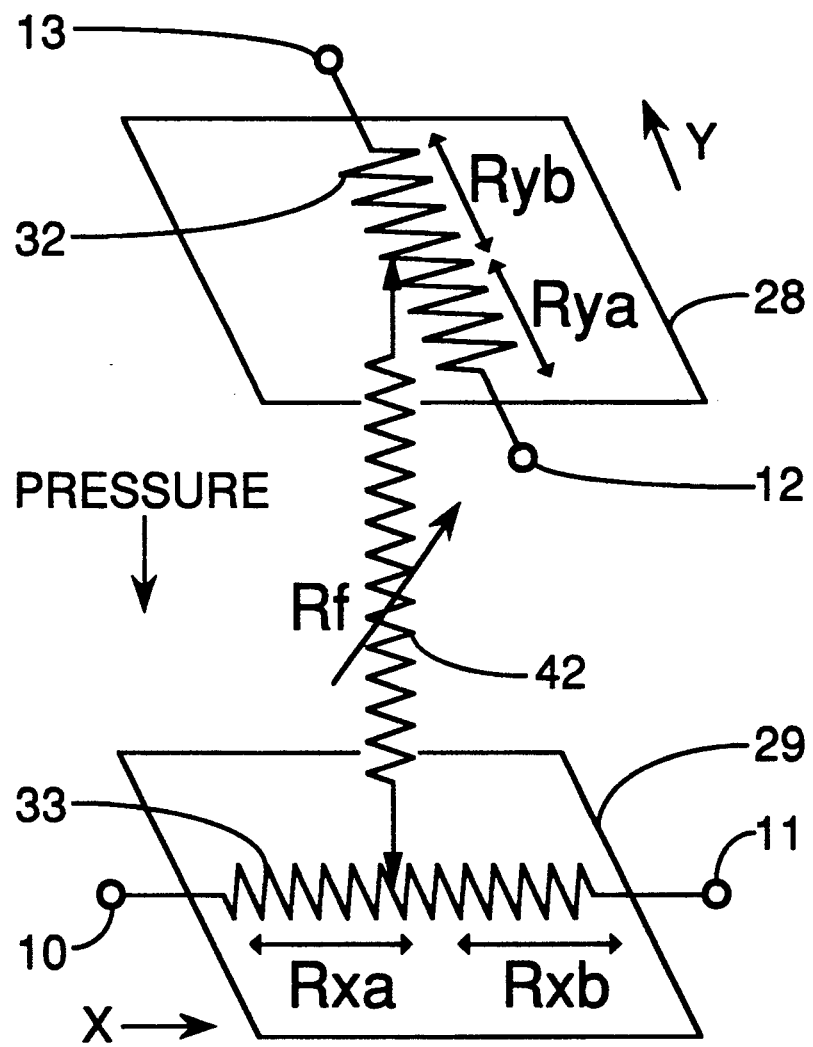
FIG. 13 shows a schematic representation of a general model of a touch sensor.

The commonality of structure and function between the touch sensors of FIGS. 1 through 11 will be demonstrated in FIGS. 12 and 13, which represent a generalized model for the touch sensor.

FIG. 12 is a cross-sectional view of a touch sensor. The upper surface of the touch sensor is the Y substrate 28, and the lower surface is the X substrate 29, although the two substrates could be formed from the same material folded over itself.

The Y substrate supports a Y resistive layer 32, which establishes a potential gradient that spans a Y spatial dimension over the surface of the Y substrate. The Y resistive layer 32 may comprise conductive traces, but must minimally comprise a fixed value resistor that establishes the potential gradient. There are also two Y terminals 12 and 13 that electrically connect to the Y resistive layer 32.

Similarly, the X substrate 29 supports an X resistive layer 33, which establishes a potential gradient that spans an X spatial dimension over the surface of the X substrate, and is electrically connected to X terminals 10 and 11. The physical area spanned by the resistive layers 32 and 33 must minimally cover the entire area to be sensed. The X and Y dimensions refer only to the direction of the potential gradients established by the fixed resistors.

Between the resistive layers 32 and 33 is a force variable resistor layer 42, which must also physically span the area to be sensed. The force variable resistor layer 42 has the characteristics of having a high resistance when there is no force applied to it, and having a resistance that decreases as an applied force is increased.

It is preferred that, with little or no applied force, the resistance of the force variable resistor layer 42 is practically infinite, so that there is no conduction between the X resistive layer 33 and the Y resistive layer 32. If a force variable resistor material is selected that does exhibit a significantly low resistance, then some other means should be employed to ensure a large resistance with no applied force. Such means could include inserting a spacer to create an air gap between the layers, or depositing minute insulating bumps on one of the layers to create a standoff.

A finger, stylus, or other member 34 applies a downward force on the upper surface of the Y substrate 28. This downward force causes the resistance of the force variable resistor layer 42 to decrease locally within the area beneath the touch point. This drop in resistance causes current to flow from the X resistive layer 33, through the force variable resistor layer 42, to the Y resistive layer 32. The position of the touch point on the surface of the touch sensor will determine at what point along the X dimension the X resistive layer conducts current, and at what point along the Y dimension the Y resistive layer conducts current, into the force variable resistor.

FIG. 13 is a schematic representation of the generalized touch sensor model. Rf is the value of the force variable resistor 42 at the touch point, which has a practically infinite resistance at all points other than the touch point. The decrease in resistance of the force variable resistor 42 will enable current to flow between the X fixed resistor 33 and the Y fixed resistor 32. The position of the touch point temporarily divides the X fixed resistor 33 into two segments having resistance values Rxa and Rxb, the intersection between Rxa, Rxb, and Rf being an electrical node. The position of the touch point also temporarily divides the Y fixed resistor 32 into two segments having resistance values Rya and Ryb; the intersection between Rya, Ryb, and Rf also being an electrical node.

Determination of the position of the touch point in the X dimension requires measuring the resistance values of Rxa or Rxb. This may be accomplished by measuring the relative value of Rxa to Rxb; by measuring the relative value of either Rxa or Rxb to the sum of Rxa and Rxb, which is a fixed value; or by measuring the absolute resistance of either Rxa or Rxb. Likewise, determination of the position of the touch point in the Y dimension requires measuring the resistance values of Rya or Ryb.

Determination of the applied pressure at the touch point requires measuring the resistance of the force variable resistor, Rf, at that point. This typically involves either an absolute measurement of the resistor value, or a measurement that is relative to some external resistor.

The difficulty in the determination of the position and pressure of the touch point arises from the fact that the internal electrical nodes that connect the fixed resistors 32 and 33 with the force variable resistor 42 are not available outside the touch sensor, and hence are not directly observable. The subsequent figures demonstrate several electronic circuits that accomplish the required measurements according to the objects of the present invention. The combination of the touch sensor with such a circuit creates a touch controller that outputs three analog voltage signals, representing the X position, Y position, and pressure of the touch point. The signals are linear representations of the actual position and pressure so that no further manipulations or calculations are required.

The outputs of the touch controller, being analog voltages, may be subsequently digitized by an analog-to-digital converter, which can then be read by a microprocessor or computer. Many choices for an analog-to-digital converter may be used to optimize a particular application, trading off cost for sampling rate, resolution, and circuit complexity. A review of analog-to-digital converters may be found in *The Art Of Electronics*, pages 415–428, Horowitz and Hill, Cambridge University Press, 1980, which is hereby included by reference.

Figure 14:
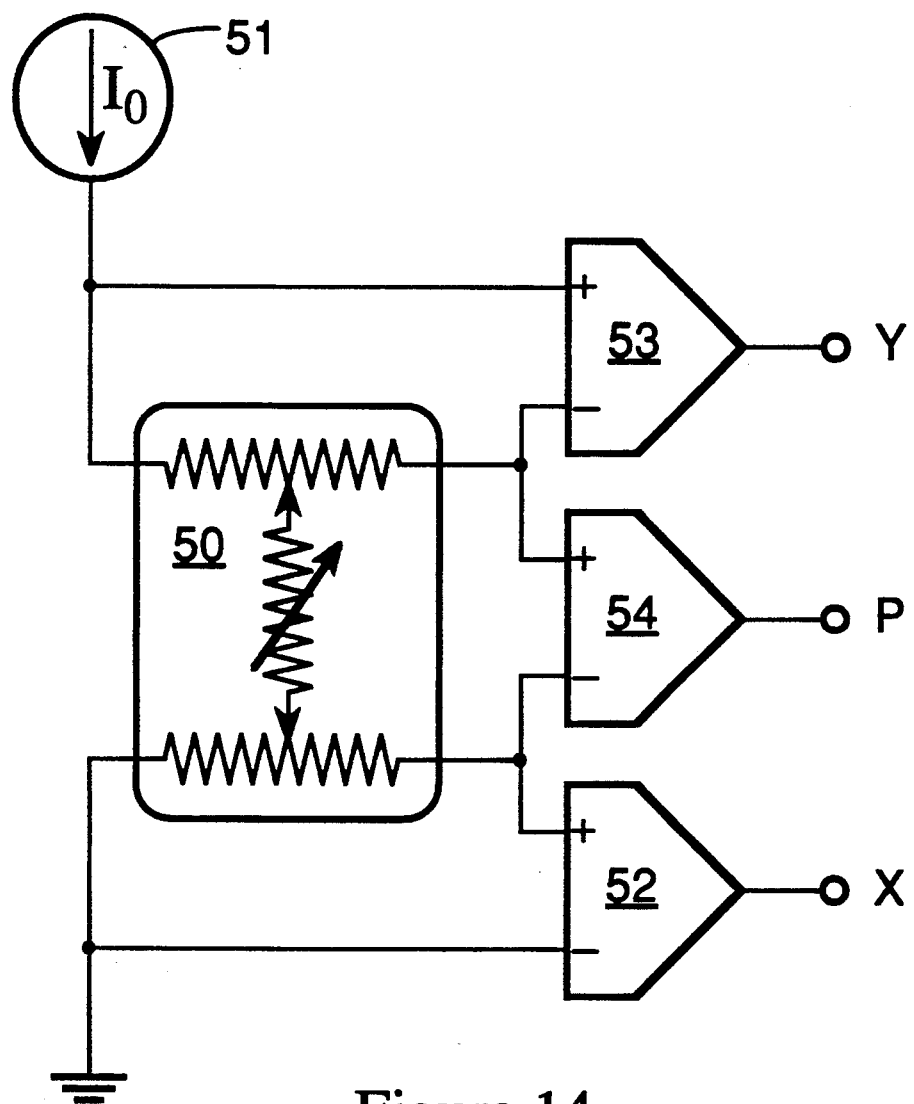
FIG. 14 shows a touch controller that regulates a constant current through a touch sensor, and detects position and pressure with differential amplifiers.

FIG. 14 shows a touch controller that uses a current regulator 51 to supply a constant current Io through the touch sensor 50. A comprehensive review of current regulator design is available in *Implementation And Applications Of Current Sources And Current Receivers*, from Burr-Brown Corporation, Tuscon, Ariz., 1989, and is hereby incorporated by reference.

The basic principle of operation of this touch controller is that a voltage drop across a resistor is proportional to current flowing through that resistor, according to the well-known law: voltage=current x resistance (i.e. V=IR). Since the current through the various resistive elements of the touch sensor is maintained at a constant Io, the voltage changes measured across any resistor in the touch sensor will be linearly proportional to any changes in that resistor. Measuring those voltage changes then directly provides accurate measurements of the resistor values, without scaling.

The touch controller comprises three differential amplifiers: 52 to measure the X position and having an X output, 53 to measure the Y position and having a Y output, and 54 to measure the pressure and having a P output. The differential amplifiers should have high impedance inputs, such as instrumentation amplifiers.

Suitable integrated circuit instrumentation amplifiers include: the AMP-01 from Precision Monolithics Inc., the LM363 from National Semiconductor Corp., and the LT1101 from Linear Technology Corp. Also, a review of the design of differential amplifiers can be found in *The Art Of Electronics*, pages 279-287, by Horowitz and Hill, Cambridge University Press, 1980, which is hereby incorporated by reference.

Differential amplifier 52 is connected to the X terminals of the touch sensor, so that it measures the differential voltage across the X fixed resistor. Because the differential amplifier has high impedance inputs, virtually no current flows from the touch point into the noninverting (+) input, so that the voltage present at the noninverting (+) input is virtually equal to the voltage at the touch point on the X fixed resistor.

Similarly, differential amplifier 53 is connected to the Y terminals of the touch sensor, so that it measures the differential voltage across the Y fixed resistor. Differential amplifier 54 is connected to one X terminal and to one Y terminal, which are also the noninverting (+) inputs of 52 and 53, so that it measures the differential voltage across the force variable resistor.

Since the current regulator output is constant Io, the voltage outputs relate to the resistances of the touch sensor as follows:

$$X = Gx\ Io\ Rxa$$

$$Y = Gy\ Io\ Rya$$

$$P = Gp\ Io\ Rf$$

where Gx, Gy, and Gp are the voltage gains of the differential amplifiers for X (52), Y (53), and P (54), respectively.

In some instances the resistance of the X fixed resistor will not be equal to the resistance of the Y fixed resistor, so it might be convenient to have different gains for each differential amplifier. Typically, the gains of these amplifiers are set so that the maximum range of voltage swings is matched to the full scale input range of an analog-to-digital converter.

Figure 15:
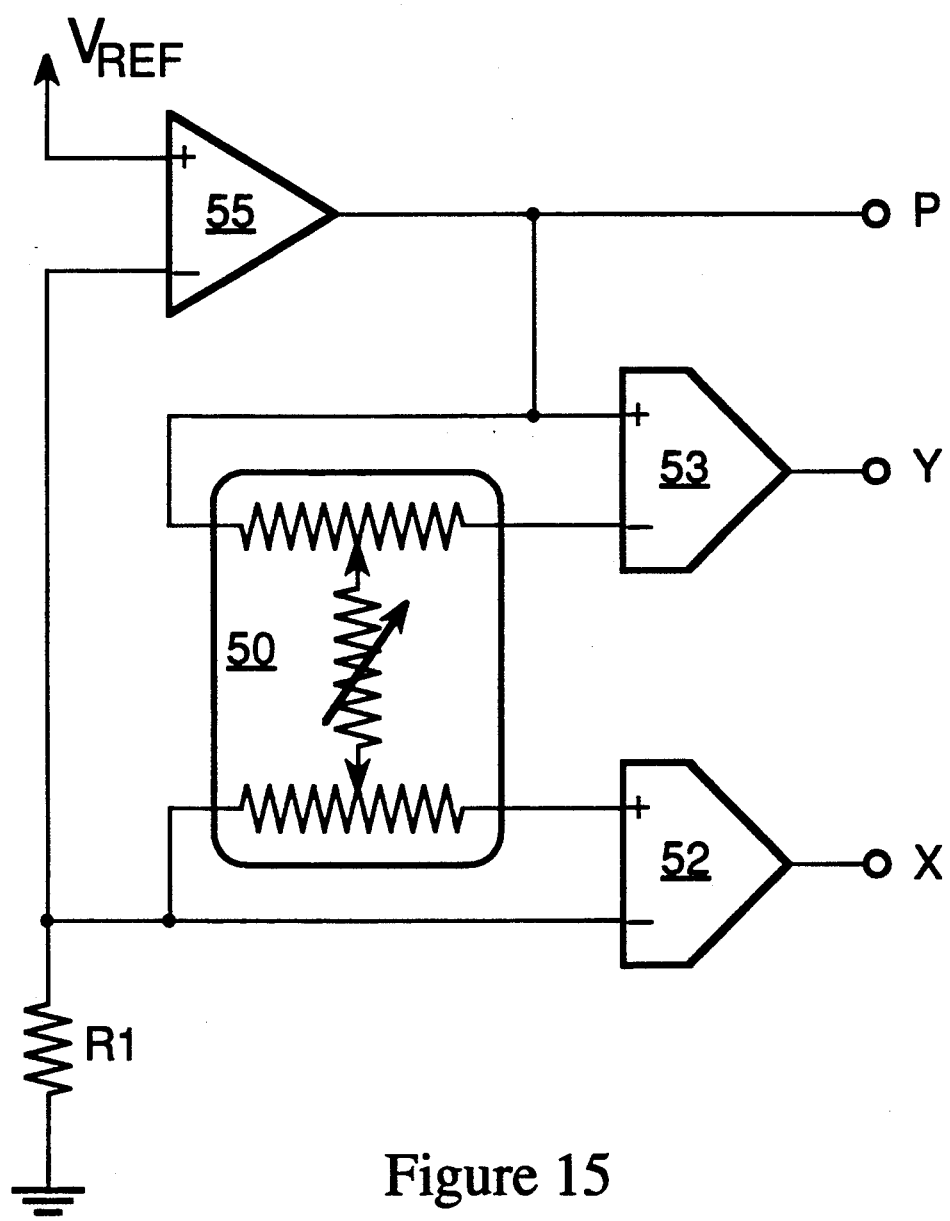
FIG. 15 shows a touch controller with a floating current regulator comprised of an operational amplifier and a resistor.

FIG. 15 is a touch controller that uses a variation of the circuit shown in the touch controller of FIG. 14. A floating current regulator is formed from operational amplifier 55 and resistor R1, with the touch sensor 50 within the feedback loop of the operational amplifier. This arrangement can produce a very fast settling and response time to changes in touch position and pressure, provided that the operational amplifier 55 has sufficient bandwidth and output drive so that it does not oscillate with the touch sensor 50 in its feedback loop. Suitable operational amplifiers include the LF351 family from National Semiconductor Corp. and the TL071 family from Texas Instruments. However, a resistor-capacitor compensation network can be used with operational amplifiers that might tend to oscillate.

Although the pressure measurement can be effected by using a third differential amplifier, in the circuit of FIG. 15 it is taken directly from the output of the operational amplifier 55, i.e. the current regulator output. The tradeoff for the savings of an additional differential amplifier is a bias voltage in the pressure measurement. There is a fixed bias voltage resulting from the voltage across R1, and additional voltage drops across each of the X and Y fixed resistors which vary with position. In many circumstances, these voltage biases are very small compared to the range of differential voltage across the pressure resistor and can be ignored. For greater accuracy, these biases can be subtracted from the pressure measurement since they are all known or measurable quantities.

Figure 16:
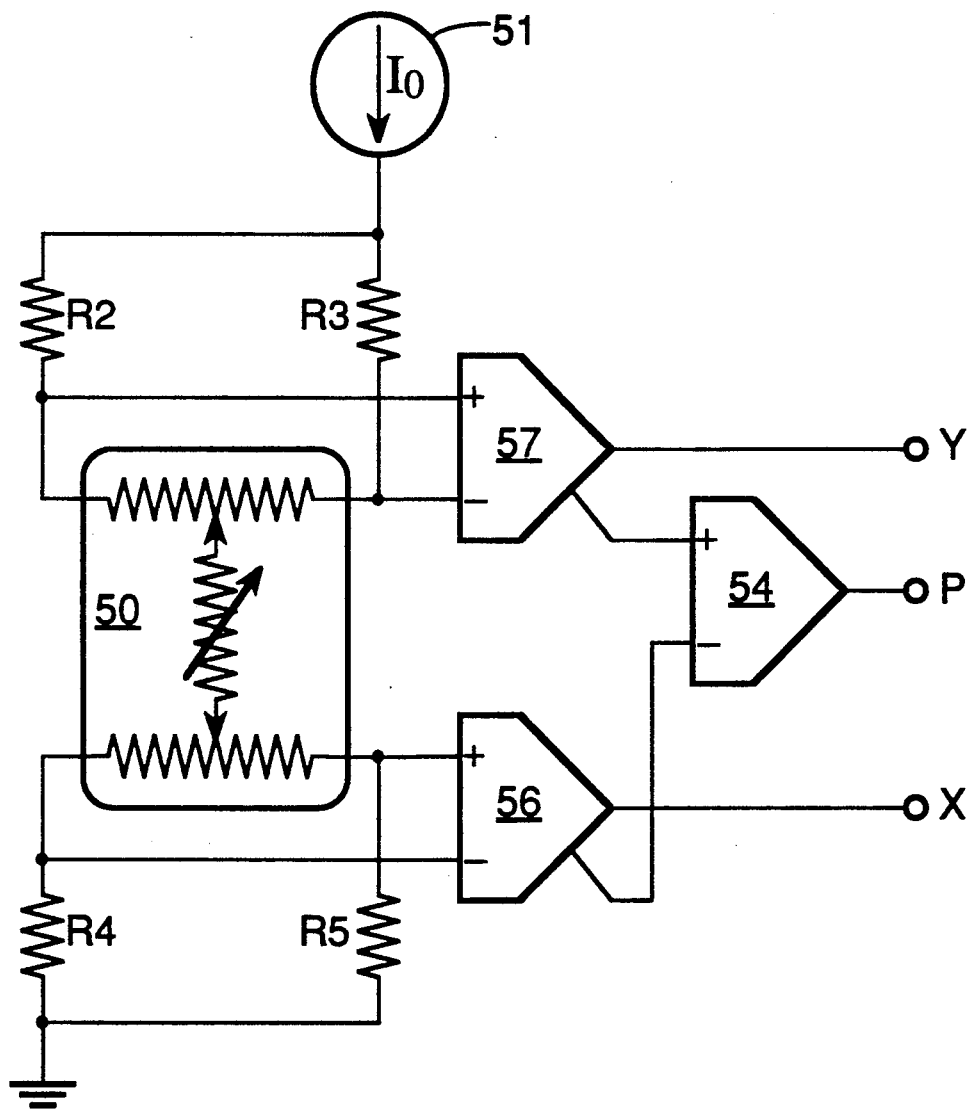
FIG. 16 shows a touch controller that comprises two Wheatstone resistor bridges for balancing the current across the fixed resistors of the touch sensor.

FIG. 16 shows a touch controller that uses an electronic circuit that draws current across the whole X fixed resistor and across the whole Y fixed resistor, as opposed to connecting one of each of the X and Y terminals to a high impedance input that draws negligible current. The total current through the touch sensor 50 is Io, and is supplied by current regulator 51.

Two resistors of equal value R2 and R3 are connected to the two Y terminals, forming a Wheatstone bridge with the two segments of the Y fixed resistor, Rya and Ryb. Similarly, two other resistors of equal value R4 and R5 are connected to the two X terminals, forming a Wheatstone bridge with the two segments of the X fixed resistor, Rxa and Rxb.

An instrumentation amplifier 57 is also connected to the Y terminals, across the Y fixed resistor, and outputs the Y position measurement. Instrumentation amplifier 57 measures the differential voltage across the Y fixed resistor, but also provides a common mode output that measures the average voltage between the Y terminals. The common mode voltage output is sometimes referred to as a "guard drive" output; it is available in some integrated circuit instrumentation amplifiers, such as the LH0036 from National Semiconductor Corp.; and is also described in *The Art Of Electronics*, as previously referenced.

Similarly, an instrumentation amplifier 56 is connected to the X terminals, across the X fixed resistor, and outputs the X position measurement. Amplifier 56 also provides a common mode output that measures the average voltage across the X fixed resistor. Both of the common mode outputs from instrumentation amplifiers 56 and 57 are input into differential amplifier 54, which differences the common mode measurements, providing the pressure output P.

The outputs of the amplifiers 56, 57, and 54 are related to the resistors of touch sensor 50 as follows:

$$X = Gx \; Io \; R4 \; (Rxb - Rxa)/(Rx + 2R4)$$

$$Y = Gy \; Io \; R2 \; (Ryb - Rya)/(Ry + 2R2)$$

$$P = Gp \; Io(Rf + Rx/2 + Ry/2)$$

where:
Rx = Rxa + Rxb
Ry = Rya + Ryb
are the constant values of the X and Y fixed resistors, respectively; R2 = R3; R4 = R5; and Gx, Gy, Gp, and Io are as previously defined.

Figure 17:
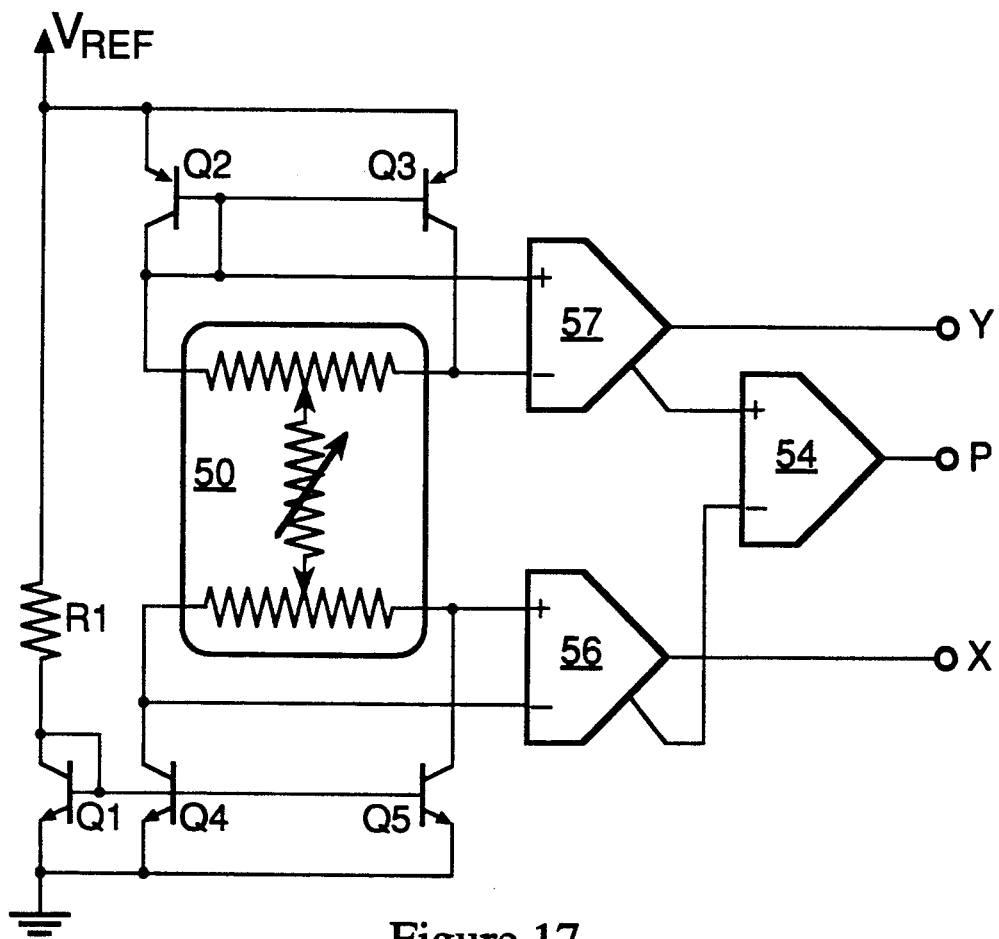
FIG. 17 shows a touch controller that comprises two bipolar transistor current mirrors for balancing the current across the fixed resistors of the touch sensor.

FIG. 17 shows a touch controller that uses an electronic circuit that draws equal currents through each of the terminals of the touch sensor 50. A dual current source is made from resistor R1 and NPN transistors Q1, Q4, and Q5; where Q4 and Q5 are in a current mirror configuration with Q1, and each draw equal currents. The value of resistor R1 and reference voltage VREF determine the constant current Io supplied by each of Q4 and Q5.

The collectors of Q4 and Q5 are connected to the Y terminals of the touch sensor 50, so that each Y fixed resistor segment, Rya and Ryb, has the constant current Io flowing through it. PNP transistors Q2 and Q3 form a current mirror, with their collectors connected to the X terminals, so that each X fixed resistor segment, Rxa and Rxb, also has the constant current Io flowing through it. Because the force variable resistor forms a node with each of the fixed resistor segments, the force variable resistor has the constant current 2Io flowing through it.

It is preferred that the NPN transistors Q1, Q4, and Q5 are fabricated on a common substrate, and that the PNP transistors Q2 and Q3 are also fabricated on a common substrate. This arrangement produces transistors with closely matched gains and temperature coefficients, so that the currents supplied by the current mirrors will be closely matched. The transistor array CA3096 from RCA conveniently contains three NPN and two PNP transistors on a single substrate.

Two instrumentation amplifiers with common mode outputs 56 and 57 are connected to the X terminals and Y terminals and provide the X and Y position outputs, respectively, in a similar arrangement as FIG. 16. Also, differential amplifier 54 connects to the common mode outputs and provides the pressure (P) output. These outputs relate to the resistors within the touch sensor 50 as follows:

$$X = Gx \; Io \; (Rxb - Rxa)$$

$$Y = Gy \; Io \; (Ryb - Rya)$$

$$P = Gp \; Io \; (2 \; Rf + Rx/2 + Ry/2)$$

where: Rx, Ry, Gx, Gy, Gp, and Io are as previously defined.

Figure 18:
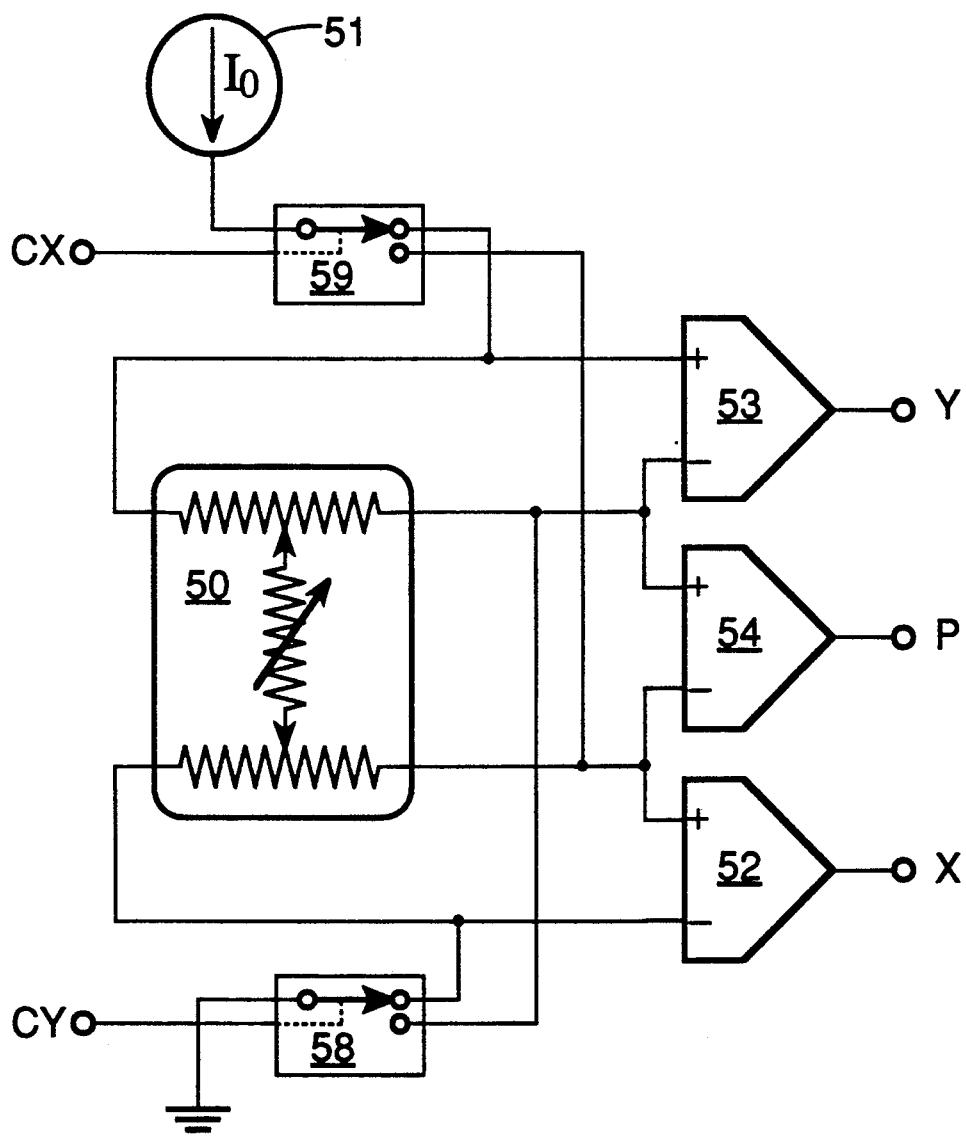
FIG. 18 shows a touch controller with analog multiplexers for isolating the fixed resistors of the touch sensors for calibration measurements.

FIG. 18 shows a touch controller with an identical circuit as the touch controller of FIG. 14, except for the addition of two analog 1-of-2 multiplexers, 58 and 59. The purpose of the analog multiplexers is to switch the current source between the X and Y terminals so that the absolute resistances of the X fixed resistor and the Y fixed resistor may be measured. Such measurements would be used as a calibration for subsequent touch position measurements, and would include any offsets and variations in the current source 51 and differential amplifiers 52 and 53. Suitable analog multiplexers include industry standard integrated circuits CD4053 and DG303.

The CX input controls analog multiplexer 59, and the CY input controls analog multiplexer 58. When both analog multiplexers are switched to the first (upper) position, the touch controller behaves as does the touch controller of FIG. 14.

When the CX signal causes analog multiplexer 59 to switch to the second (lower) position, the current source is switched from one of the Y terminals to one of the X terminals. Current is thereby prevented from flowing through the force variable resistor and the Y fixed resistor. Instead, the current flows through the entire length of the X fixed resistor, resulting in an X measurement that is the maximum possible for any touch point.

Similarly, the CY input may cause the analog multiplexer 58 to switch to the second position, resulting in a Y measurement that is the maximum possible for any touch point. In general, it is not necessary to calibrate the force variable resistor for these circuits, since its full range of values is determined by the voltage compliance limits of the current source.

Figure 19:
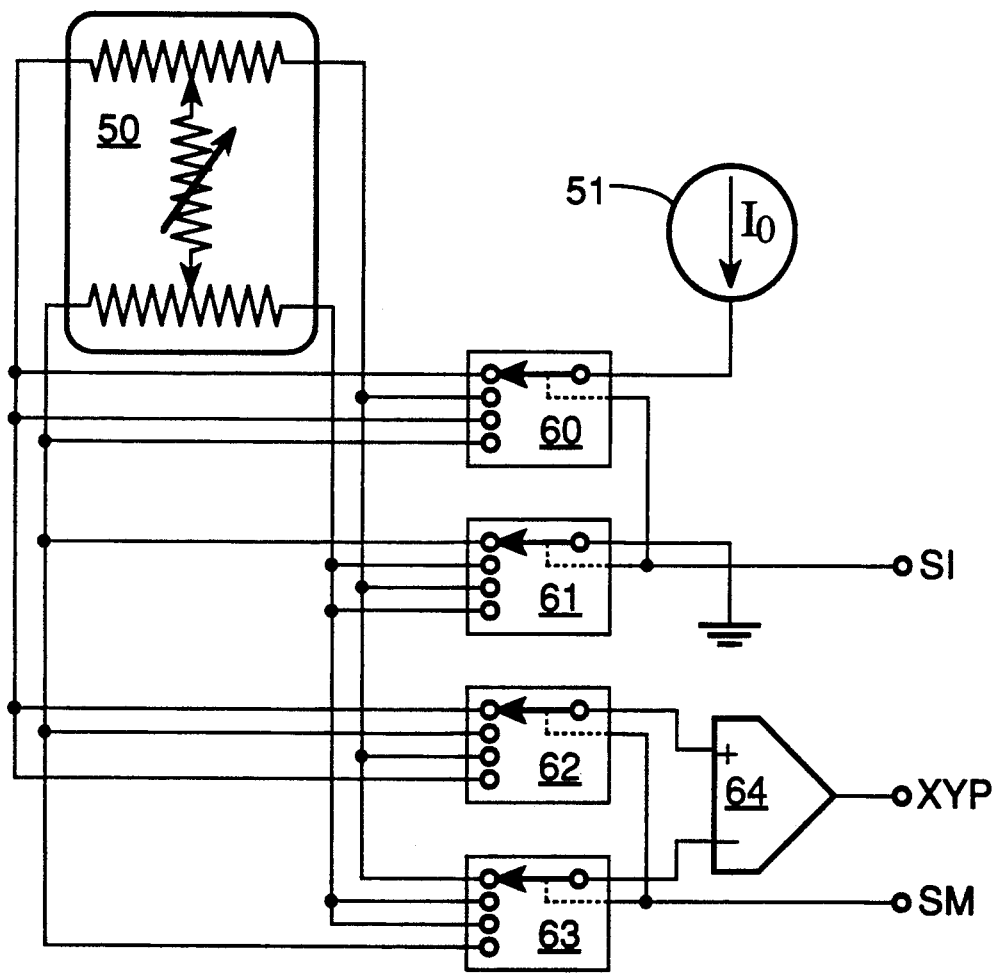
FIG. 19 shows a touch controller that minimizes hardware requirements by using analog multiplexers with a current regulator and a single differential amplifier.

FIG. 19 shows a touch controller with a circuit that functions using the same principles as the touch controller of FIG. 14, except a single differential amplifier 64 is used in conjunction with several analog 1-of-4 multiplexers 60–63, rather than three separate differential amplifiers. Suitable analog multiplexers include the industry standard integrated circuits CD4052 and DG509. Current regulator 51 supplies current Io which is switched by the analog multiplexers 60–63 across touch sensor 50.

This touch controller is most useful in cost-critical situations where continuously available outputs are not required and slower response time may be traded off for decreased circuit cost and complexity. The X position, Y position, and pressure signals are time-multiplexed from the output of the differential amplifier 64, and the selection of the measurement is controlled by the state of the SI (select current source) and SM (select measurement) inputs. The SI input controls analog multiplexers 60 and 61, which switch the current regulator and ground across the touch sensor's terminals. The SM input controls analog multiplexers 62 and 63, which switch the inputs of the differential amplifier 64 across the touch sensor's terminals.

The desired measurement that is output from the touch controller is determined by the SI and SM inputs as follows:

| Measurement | SM state | SI state | Result |
| --- | --- | --- | --- |
| Ry | 1 | 3 | calibrate y |
| Ryb | 1 | 1 | y position (b) |
| Rya | 1 | 2 | y position (a) |
| Rx | 2 | 4 | calibrate x |
| Rxb | 2 | 1 | x position (b) |
| Rxa | 2 | 2 | x position (a) |
| Rf(b) | 3 | 1 | pressure (b side) |
| Rf(a) | 4 | 2 | pressure (a side) |

For greatest accuracy using this touch controller, the following post-processing and measurement calibration is preferred. Typically, this processing is performed in software after the position and pressure signals are digitized, however it may also be performed in analog or digital hardware.

$$y\ position = (Ryb - Rya)/Ry$$

$$x\ position = (Rxb - Rxa)/Rx$$

$$pressure = (Rf(b) + Rf(a))/(2Rf(max))$$

Rf(max) is the value of the pressure measurement when there is no force applied to the touch sensor, which should equal the compliance limit of the current regulator 51. The resulting X and Y position values range from $-1.0$ to $+1.0$, with the coordinate point (0.0,0.0) being the center of the touch sensor's coordinate system. The resulting pressure value ranges from 0.0 (no touch) to $+1.0$ (maximum touch pressure).

Figure 20:
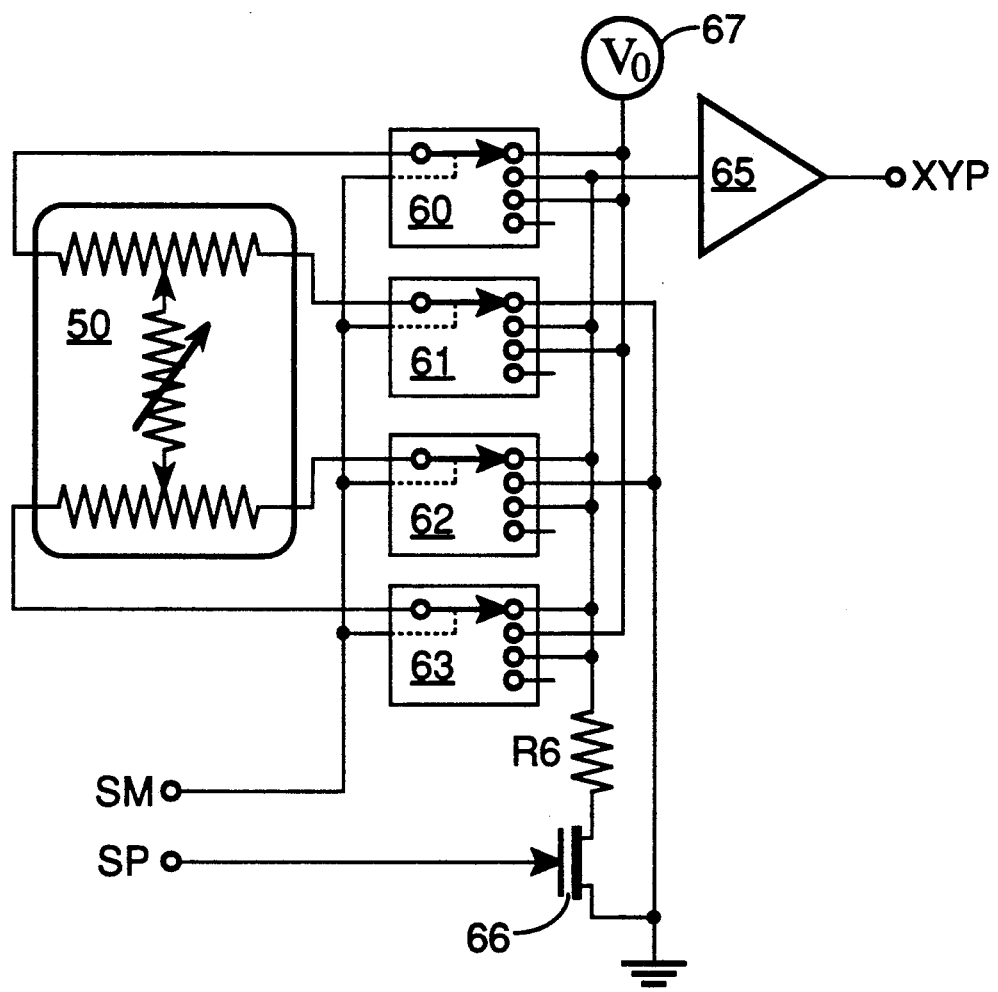
FIG. 20 shows a touch controller that minimizes hardware requirements by using analog multiplexers, a voltage regulator, single-ended amplifier, and pulldown resistor.

FIG. 20 shows a touch controller with an electronic circuit that does not require a current regulator or a differential amplifier. Although this circuit has greater susceptibility to noise and interference, and does not offer continuously available outputs, its simplicity might be useful in extremely cost-critical situations.

Four analog 1-of-4 multiplexers 60–63 are connected to the four terminals of the touch sensor 50. The SM (select measurement) input signal simultaneously controls the state of all of the analog multiplexers. The analog multiplexers can connect the touch sensor terminal to: a voltage regulator 67 which supplies a constant voltage Vo; circuit ground; a pull-down resistor R6; and the input of a single-ended amplifier 65.

The pull-down resistor R6 is needed only for pressure measurements, and is grounded by switch 66, which could be a simple transistor or an analog switch such as industry standard integrated circuit CD4066. Switch 66 is controlled by the SP (select pressure) input signal. When not pulled down, resistor R6 does not affect the circuit. The single-ended amplifier 65 could be a standard operational amplifier, or the input buffer to a sample-and-hold circuit or analog-to-digital converter.

The principle of operation of this circuit is simply to treat each of the X and Y fixed resistors as a potentiometer, with the touch point and force variable resistor serving as the wiper. To measure pressure, the voltage drop across the entire touch sensor 50 is compared to the voltage drop across pull-down resistor R6, in a simple voltage-divider network.

The position and pressure measurements are obtained from the output of the single-ended amplifier 65 in a time-multiplexed fashion, according to the state of the SM and SP inputs as follows:

| Measurement | SM state | SP state | Result |
| --- | --- | --- | --- |
| Ryb | 1 | off | y position |
| Rxb | 2 | off | x position |
| Rf | 3 | on | pressure |

The implementations described above present just several examples of many possibilities for touch sensor design and implementations of a touch controller, adapted from the basic principles of this invention as shown in FIGS. 12 and 13.

In particular, a touch sensor that accurately detects the position and pressure of a touch point on its surface may be constructed by establishing a first potential gradient across a lower substrate using a fixed value resistor; establishing a second potential gradient across an upper substrate using a second fixed resistor; and placing a force variable resistor layer in between the two substrates, so that current flows from the first fixed resistor through the force variable resistor and into the second fixed resistor at the touch point when pressure is applied.

Two approaches to making a touch controller based on this touch sensor are presented. The first touch controller uses an electronic circuit that maintains a constant current through the touch sensor, and measures the touch position using a differential amplifier placed across each fixed resistor. The second touch controller uses an electronic circuit that maintains a constant voltage across the touch sensor, and measures the touch position using a single-ended amplifier that reads the voltage drop across each fixed resistor in series with the force variable resistor.

The embodiments of touch sensors and touch controllers based on this invention provide many improvements over the prior art of position-and-pressure sensitive touch sensors. Unlike capacitive technologies and surface-acoustic wave technologies, as commonly used in computer touch screens, the touch sensor of the present invention is completely sealed so that many different coverings and graphic overlays may be used, and the present invention may be activated with a wide variety of control members, such as a finger or stylus. The simpler electronics of the present invention also result in less expensive and more reliable product designs.

Technologies using force variable resistor inks in a scanning mode employ a touch sensor that has many of the advantages of the touch sensor of the present invention, however scanning-type systems require an enormous number of terminals to be brought forth from the sensor; the scanning hardware is complex and requires fast analog-to-digital converters; the response time is slow due to the time required to complete a scanning cycle; the data rates produced are high, requiring enormous computational and memory overhead to process and interpret the data; and the hardware and computational overhead increase exponentially for linear increases in sensor size or sensor resolution. In cost sensitive applications, such as high-volume consumer products, or in many applications that only require sensing a single touch point, the present invention suffers from none of the drawbacks exhibited by scanning technologies.

The present invention overcomes many of the drawbacks of prior pressure-sensitive touch sensors that comprise fixed resistors and force variable resistors. Comprising only two substrate layers, the present invention minimizes the amount of material required for fabrication, and ensures maximum sensitivity because both position dimensions make contact simultaneously. This also simplifiers assembly of mass-produced devices because the touch sensor can be produced from a single film with only four terminals emerging on the same side of the same substrate. Only a single pressure signal is generated by the present invention, simplifying construction, reducing circuit cost and reducing post-processing overhead. The force variable resistor of the present invention conducts current perpendicular to the plane of the resistor, reducing contact noise and allowing a wide variety of force variable resistor materials to be used. Because interdigitated pickup traces are not required, the resolution of the touch sensor is only limited by the resolution of the printing technology used for sensor fabrication.

A great many variations on the embodiments of the present invention are possible. The touch sensor can be constructed from a single substrate folded over itself, or from two independent substrates sandwiched together. One substrate may be stiff, such as a printed circuit board or glass. One substrate may also contain the touch controller electronic circuitry, such as a printed circuit board or flexible circuit laminates. Many flexible substrate materials may be used, such as polyester and polyimide films. Fixed resistors may be implemented in various ways, such as thin films directly deposited on the substrate, or discrete resistor networks. The potential gradients may be established over the substrate surfaces in various ways, such as conductive traces, resistive traces, and resistive sheets. Many force variable resistor materials may be used, including semiconductive inks and semiconductive rubber sheets. Many coordinate systems may be defined by changing the patterns of the potential gradient, such as a cartesian coordinate system or a polar coordinate system.

The available electronics literature provides many suitable methods of constructing current regulators (sources, sinks, and mirrors) as well as differential (including instrumentation) amplifiers. The sense of voltage in each circuit is easily reversed (i.e. positive versus negative voltages and currents) without affecting operation. The circuits may be constructed using bipolar power supplies or single-sided power supplies. Various methods may be used to draw current across the fixed terminals while maintaining a linear relationship between the measured and actual touch position, including drawing current in only one direction over the fixed resistor, and using a resistive Wheatstone Bridge or current mirror across the fixed resistor. Analog multiplexers may be used to reduce hardware requirements, trading off response time of the touch sensor. Simple electronic means, using a voltage regulator and single-end amplifier, may be used to read the touch sensor, trading off sensitivity and noise immunity.

It should be appreciated that the present invention as described herein may be modified or adapted in applying the principles of the present invention to different situations. Accordingly, the embodiments described herein should not be taken as a limitation on the scope of the present invention, but rather the invention should only be interpreted in accordance with the following claims.

What is claimed is:

1. A touch sensor for detecting the variable force and the force-weighted average position of external forces exerted against the outer surface of the touch sensor, comprising:

an X insulating substrate forming a first outer surface of the touch sensor;

a plurality of X conductive traces deposited on the X substrate;

an X fixed resistor deposited on the X substrate and connected to each of the X conductive traces thereby providing a fixed resistance between adjacent X conductor traces;

two X terminals connected to either end of the X fixed resistor for interfacing the X fixed resistor to external circuitry;

a Y insulating substrate forming a second outer surface of the touch sensor;

a plurality of Y conductive traces deposited on the Y substrate and arranged in orthogonal orientation to the X conductive traces;

a Y fixed resistor deposited on the Y substrate and connected to each of the Y conductive traces thereby providing a fixed resistance between adjacent Y conductor traces;

two Y terminals connected to either end of the Y fixed resistor for interfacing the Y fixed resistor to external circuitry; and a through-mode force variable resistor layer positioned between the X conductive traces and the Y conductive traces and providing a resistance from at least one X conductive trace to at least one Y conductive trace that decreases with increasing external force.

2. A touch sensor as recited in claim 1, wherein the force variable resistor layer comprises:

a plurality of X through-mode force variable resistor traces, each X force variable resistor trace deposited over a single X conductive trace; and a plurality of Y through-mode force variable resistor traces, each Y force variable resistor trace deposited over a single Y conductive trace.

3. A touch sensor as recited in claim 2, further comprising:

a plurality of insulating traces distributed over the area between the X force variable resistor traces and the Y force variable resistor traces, whereby an external force exerted against an outer surface of the touch sensor causes at least one X force variable trace to contact at least one Y force variable trace when the pressure exerted by an external force exceeds a pressure threshold determined by the insulating traces.

4. A touch sensor as recited in claim 1, wherein the force variable resistor layer comprises:
an X through-mode force variable resistor layer deposited over the X conductive traces; and
a Y through-mode force variable resistor layer deposited over the Y conductive traces.

5. A touch sensor as recited in claim 4, further comprising:
a plurality of insulating bumps distributed over the area between the X force variable resistor layer and the Y force variable resistor layer, whereby an external force exerted against an outer surface of the touch sensor causes the X force variable resistor layer to contact the Y force variable resistor layer when the pressure exerted by an external force exceeds a pressure threshold determined by the insulating bumps.

6. A touch sensor as recited in claim 1, wherein the force variable resistor layer is a sheet of through-mode force variable resistive material inserted between the X conductive traces and the Y conductive traces.

7. A touch sensor as recited in claim 1, further comprising:
at least one X zone terminal connected to the X fixed resistor at a point between the X terminals whereby each X zone terminal partitions the touch sensor into two X touch zones on either side of the X zone terminal and each X touch zone can detect an external force independently and simultaneously of the other X touch zones.

8. A touch sensor for detecting the variable force and the force-weighted average position of external forces exerted against the outer surface of the touch sensor, comprising:
an X insulating substrate forming a first outer surface of the touch sensor;
an X resistor layer deposited on the X substrate, having a fixed resistance within the plane of the touch sensor and having a force variable resistance normal to the plane of the touch sensor;
two X terminals connected to each of two opposing sides of the X resistor layer for interfacing the X resistor layer to external circuitry;
a Y insulating substrate forming a second outer surface of the touch sensor;
a Y resistor layer deposited on the Y substrate, having a fixed resistance within the plane of the touch sensor and having a force variable resistance normal to the plane of the touch sensor; and
two Y terminals connected to each of two opposing sides of the Y resistor layer and oriented in an orthogonal direction to the X terminals for interfacing the Y resistor layer to external circuitry, whereby an external force exerted against an outer surface of the touch sensor causes a region of the X resistor layer to contact a region of the Y resistor layer and the resistance between the X resistor layer and the Y resistor layer decreases with increasing force.

9. A touch sensor as recited in claim 8, further comprising:
a plurality of X conductive traces deposited on the X substrate beneath the X resistor for improving the linearity of the X resistor; and
a plurality of Y conductive traces deposited on the Y substrate beneath the Y resistor for improving the linearity of the Y resistor.

10. A touch sensor as recited in claim 8, further comprising:
a plurality of insulating bumps distributed over the area between the X resistor layer and the Y resistor layer, whereby an external force exerted against an outer surface of the touch sensor causes the X resistor layer to contact the Y resistor layer when the pressure exerted by an external force exceeds a pressure threshold determined by the insulating bumps.

11. A touch sensor as recited in claim 8, further comprising:
at least one X zone terminal connected to the X resistor layer at a point between the X terminals whereby each X zone terminal partitions the touch sensor into two X touch zones on either side of the X zone terminal and each X touch zone can detect an external force independently and simultaneously of the other X touch zones.

12. A touch controller for measuring and reporting the variable force and the force-weighted average position along an X dimension and along a Y dimension of external forces exerted against the outer surface of a touch sensor, comprising:
a touch sensor as recited in claim 1 or as recited in claim 8;
a constant current source coupled to the touch sensor for maintaining a prescribed current through the touch sensor;
at least one differential amplifier coupled to the touch sensor for measuring differential voltages across resistors within the touch sensor.

13. A touch controller as recited in claim 12, wherein:
a first differential amplifier coupled to the X terminals of the touch sensor reports the force-weighted average position of an external force along the X dimension;
a second differential amplifier coupled to the Y terminals of the touch sensor reports the force-weighted average position of an external force along the Y dimension; and
a third differential amplifier coupled to one of the X terminals and to one of the Y terminals of the touch sensor reports the variable force.

14. A touch controller as recited in claim 12, further comprising:
a pair of X bridge resistors coupled to the X terminals of the touch sensor for balancing the current through each of the X terminals; and
a pair of Y bridge resistors coupled to the Y terminals of the touch sensor for balancing the current through each of the Y terminals, whereby the current source is coupled to the series combination of the X bridge resistors, the touch sensor, and the Y bridge resistors.

15. A touch controller as recited in claim 12, wherein the current source is coupled to one of the Y terminals of the touch sensor, and further comprising:
a second constant current source coupled to the other Y terminal of the touch sensor and sourcing a current that is equal to the current sourced by the first current source; and
a current mirror coupled to the X terminals of the touch sensor for maintaining equal currents through each of the X terminals.

16. A touch controller as recited in claim 12, further comprising:
- a first plurality of analog switches coupled to the touch sensor for sequentially coupling the current source to the X terminals and to the Y terminals; and
- a second plurality of analog switches coupled to the differential amplifier for sequentially coupling the differential amplifier to the X terminals and to the Y terminals.

17. A touch controller for measuring and reporting the variable force and the force-weighted average position along an X dimension and along a Y dimension of external forces exerted against the outer surface of a touch sensor, comprising:
- a touch sensor as recited in claim 1 or as recited in claim 8;
- a plurality of analog switches coupled to the touch sensor;
- a constant voltage source coupled to the analog switches;
- an amplifier coupled to the analog switches, whereby the position along the X dimension is measured by coupling the voltage source across the X terminals and coupling the amplifier to at least one of the Y terminals, the position along the Y dimension is measured by coupling the voltage source across the Y terminals and coupling the amplifier to at least one of the X terminals, and the force is measured by coupling the voltage source across one of the X terminals and one of the Y terminals and coupling the amplifier to at least one of the other X terminal and the other Y terminal.

* * * * *